US012655886B2

(12) United States Patent
Mossop et al.

(10) Patent No.: US 12,655,886 B2
(45) Date of Patent: Jun. 16, 2026

(54) CABLE TENSIONING SYSTEM AND DIAL

(71) Applicant: Apple Inc., Cupertino, CA (US)

(72) Inventors: Aiden D. Mossop, San Francisco, CA (US); Yiwei Tao, Campbell, CA (US); Tingqing Liao, Singapore (SG); Rachel L. Rieger, Mountain View, CA (US); Javier Mendez, San Jose, CA (US); Ryan M. David, San Francisco, CA (US)

(73) Assignee: APPLE INC., Cupertino, CA (US)

( * ) Notice: Subject to any disclaimer, the term of this patent is extended or adjusted under 35 U.S.C. 154(b) by 243 days.

(21) Appl. No.: 18/463,187

(22) Filed: Sep. 7, 2023

(65) Prior Publication Data

US 2024/0093758 A1      Mar. 21, 2024

Related U.S. Application Data

(60) Provisional application No. 63/376,284, filed on Sep. 19, 2022.

(51) Int. Cl.
H05K 5/02 (2006.01)
F16G 11/12 (2006.01)

(52) U.S. Cl.
CPC ........... F16G 11/12 (2013.01); H05K 5/0217 (2013.01)

(58) Field of Classification Search
CPC ........................... H05K 5/0017; H05K 5/0217

USPC .......................................................... 361/807
See application file for complete search history.

(56) References Cited

U.S. PATENT DOCUMENTS

2009/0230229 A1      9/2009  Yasuda et al.

FOREIGN PATENT DOCUMENTS

| CN | 211506037 U | * | 9/2020 | ............. G02B 27/01 |
| KR | 102189249 B1 | | 12/2020 | |
| WO | 2022183728 A1 | | 9/2022 | |

OTHER PUBLICATIONS

Extended European Search Report dated Feb. 26, 2024 for EP Application No. 23198058.2, 7 pgs.

* cited by examiner

*Primary Examiner* — Hung S. Bui

(74) *Attorney, Agent, or Firm* — Dorsey & Whitney LLP

(57) ABSTRACT

A cable tensioning system including a roller-and-wedge clutch is disclosed. The cable tensioning system can be used in an adjustable headband for a head-mountable display. In an example, a tensioning system includes a cable; a cam wheel including a roller opening, the cam wheel including a ramped surface adjacent the roller opening; a dial housing encircling the cam wheel; and a roller in the roller opening, the roller being configured to roll along the ramped surface, the roller being configured to lock the cam wheel and the dial housing when the cable moves in a first direction, the roller being configured to unlock the cam wheel and the dial housing when the cable moves in a second direction opposite the first direction.

20 Claims, 13 Drawing Sheets

CABLE TENSIONING SYSTEM AND DIAL

CROSS-REFERENCE TO RELATED APPLICATION(S)

This claims priority to U.S. Provisional Patent Application No. 63/376,284, filed 19 Sep. 2022, and entitled "CABLE TENSIONING SYSTEM AND DIAL," the entire disclosure of which is hereby incorporated by reference.

FIELD

The described examples relate generally to tensioning systems. More particularly, the present examples relate to a cable tensioning system featuring a dial that alters tension in a cable.

BACKGROUND

Dial-based cable tensioning systems are used in an increasing number of applications, including clothing, such as lacing systems for footwear, tensioning systems for headwear, and the like. Dial-based tensioning systems can feature various improvements over conventional tensioning systems, such as low friction and equilibrated tensioning pressure across contact surfaces (e.g., in the case of headwear, equal pressure is applied around a user's head). However, current dial-based tensioning systems are often noisy when users manipulate the dial, which can be problematic or irritating. In addition, current dial-based tensioning systems can fail to maintain the desired pressure across the contact surface over time. Improvements and advances to dial-based tensioning systems can be desirable to provide additional functionality in a variety of situations and environments.

SUMMARY

According to some aspects of the present disclosure, a head-mountable display (HMD) can include a head-mountable housing; a strap coupled to the head-mountable housing; and an adjustable headband coupled to the coupling member. The adjustable headband can include a band; a cable coupled to the band; and a tensioning system coupled to the band and the cable. The tensioning system can include a dial housing; a cam wheel in the dial housing; a dial wheel; and a roller. The cam wheel can include a roller opening and a ramped surface defining the roller opening. The ramped surface is inclined relative to a line tangential to a point on the dial housing in contact with the roller.

The dial wheel can be configured to adjust a tension of the cable. The dial wheel can include a protrusion in the roller opening. The roller can be disposed in the roller opening between the ramped surface and the dial housing and adjacent to the protrusion. The roller can be configured to roll along the ramped surface to lock the cam wheel and the dial housing in response to the cable moving in a first direction. In some examples, the roller can be configured to roll along the ramped surface to unlock the cam wheel and the dial housing in response to the cable moving in a second direction opposite the first direction. In some examples, the cam wheel can include a second roller opening and a second ramped surface defining the second roller opening. In some examples, the HMD can include a second roller in the second roller opening between the second ramped surface and the dial housing. In some examples, the second roller can be configured to roll along the second ramped surface to lock the cam wheel and the dial housing in response to the cable moving in a second direction opposite the first direction. In some examples, the dial wheel can be configured to unlock the cam wheel and the dial housing in response to the dial wheel being rotated in a second direction or a third direction opposite the second direction.

In some examples, a cam angle measured between the ramped surface and a line tangential to a point of the housing in contact with the roller can be in a range from about 5 degrees to about 30 degrees. In some examples, the roller can have a travel angularly in the roller opening in a range from about 1 degree to about 20 degrees. In some examples, the tensioning system can include six rollers in six roller openings of the cam wheel.

According to some examples, an adjustable-tension headband for a head-mountable display (HMD) can include a band; a cable fastened to the band; and an adjustable cable tensioning mechanism fastened to the band. In some examples, the adjustable cable tensioning mechanism can include a spool; a cam wheel; and a roller. In some examples, the cable can be fastened to the spool. In some examples, the cam wheel can be rotatably coupled to the spool. In some examples, the roller can be in a roller opening of the cam wheel. In some examples, the roller can be configured to roll along a ramped surface of the cam wheel defining the roller opening to lock and unlock the spool.

In some examples, the adjustable cable tensioning mechanism can include a dial housing in which the spool and the cam wheel are disposed. In some examples, the roller can be configured to be wedged between the dial housing and the spool to lock the spool. The dial housing can define a first opening to receive an end of the cable, and a second opening to access the end of the cable, the first opening and the second opening connected via a channel defined by the spool. In some examples, the adjustable cable tensioning mechanism can include a dial wheel. In some examples, the dial wheel can be configured to adjust a tension of the cable. In some examples, the dial wheel can be configured to rotate in a first direction and a second direction opposite the first direction. In some examples, the dial wheel can be configured to unlock the spool in response to the dial wheel being rotated in the first direction or the second direction. In some examples, the dial wheel can include an internal portion comprising a protrusion in the roller opening. In some examples, the protrusion can be configured to contact the roller to unlock the spool in response to the dial wheel being rotated in the first direction.

In some examples, the adjustable cable tensioning mechanism can include a dial center cap that can include a first protrusion and a dial center cap post; a second protrusion; and a first disc mounted on the dial center cap post. In some examples, the dial center cap can be rotatably fixed relative to the band; the second protrusion can be rotatably coupled to the cam wheel; and the first disc can include a third protrusion that can be configured to interact with the first protrusion and a fourth protrusion that can be configured to interact with the second protrusion. In some examples, the first disc can be configured to provide an angular restraint between the dial center cap and the cam wheel.

In some examples, the adjustable cable tensioning mechanism can include a dial center cap that can include a dial center cap post; and a restraint cable. In some examples, the dial center cap post can be rotatably fixed relative to the band. In some examples, the restraint cable can include a first end mounted on the dial center cap and a second end rotatably coupled to the cam wheel. In some examples, the restraint cable can be configured to wrap around or unwrap from the dial center cap post in response to the cam wheel rotating. In some examples, the restraint cable can be configured to provide an angular restraint between the dial center cap and the cam wheel.

In some examples, the adjustable cable tensioning mechanism can include a dial center cap rotatably fixed relative to the band. In some examples, the dial center cap can include a dial center cap post. In some examples, the dial center cap post can include a helical ridge, and the cam wheel can include a helical groove. In some examples, the helical ridge and the helical groove can be configured to provide an angular restraint between the dial center cap and the cam wheel.

In some examples, the adjustable cable tensioning mechanism can include a dial center cap that can include a spiral groove; and a restraint protrusion slidably fixed to the cam wheel. In some examples, the dial center cap can be rotatably fixed relative to the band. In some examples, the restraint protrusion can be disposed in the spiral groove. In some examples, the restraint protrusion and the spiral groove can be configured to provide an angular restraint between the dial center cap and the cam wheel.

According to some aspects, a tensioning system can include a cable; a cam wheel; a dial housing encircling the cam wheel; and a roller. In some examples, the cam wheel can include a roller opening. In some examples, the cam wheel can include a ramped surface defining the roller opening. In some examples, the roller can be disposed in the roller opening. In some examples, the roller can be configured to roll along the ramped surface. In some examples, the roller can be configured to lock the cam wheel and the dial housing when the cable moves in a first direction. In some examples, the roller can be configured to unlock the cam wheel and the dial housing when the cable moves in a second direction opposite the first direction.

In some examples, the tensioning system can include a dial center cap rotatably coupled to the dial housing; and a dial wheel between the dial center cap and the dial housing. In some examples, the dial wheel can be configured to unlock the cam wheel and the dial housing and to add tension to the cable when the dial wheel rotates in a third direction. In some examples, the dial wheel can be configured to unlock the cam wheel and the dial housing and to reduce tension in the cable when the dial wheel rotates in a fourth direction opposite the third direction. In some examples, the tensioning system can include an angular restraint rotatably coupled to the dial center cap and the dial wheel. In some examples, the angular restraint can be configured to limit an angular rotation of the dial when in the third direction and the fourth direction.

In some examples, the dial center cap can include a ball, and a detent spring in contact with the ball. In some examples, the dial wheel can include a grooved internal surface adjacent the ball. In some examples, the detent spring can push the ball into the grooved internal surface of the dial wheel. In some examples, the detent spring and the ball can be configured to click when the dial wheel rotates in the third direction or the fourth direction.

In some examples, the dial housing can include an inner housing ring that can be configured to contact the roller. In some examples, the roller, the inner housing ring, and the cam wheel can include a metal material. In some examples, the roller can include a coating material. In some examples, the roller can have a first hardness greater than a second hardness of the inner housing ring and a third hardness of the cam wheel.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1:
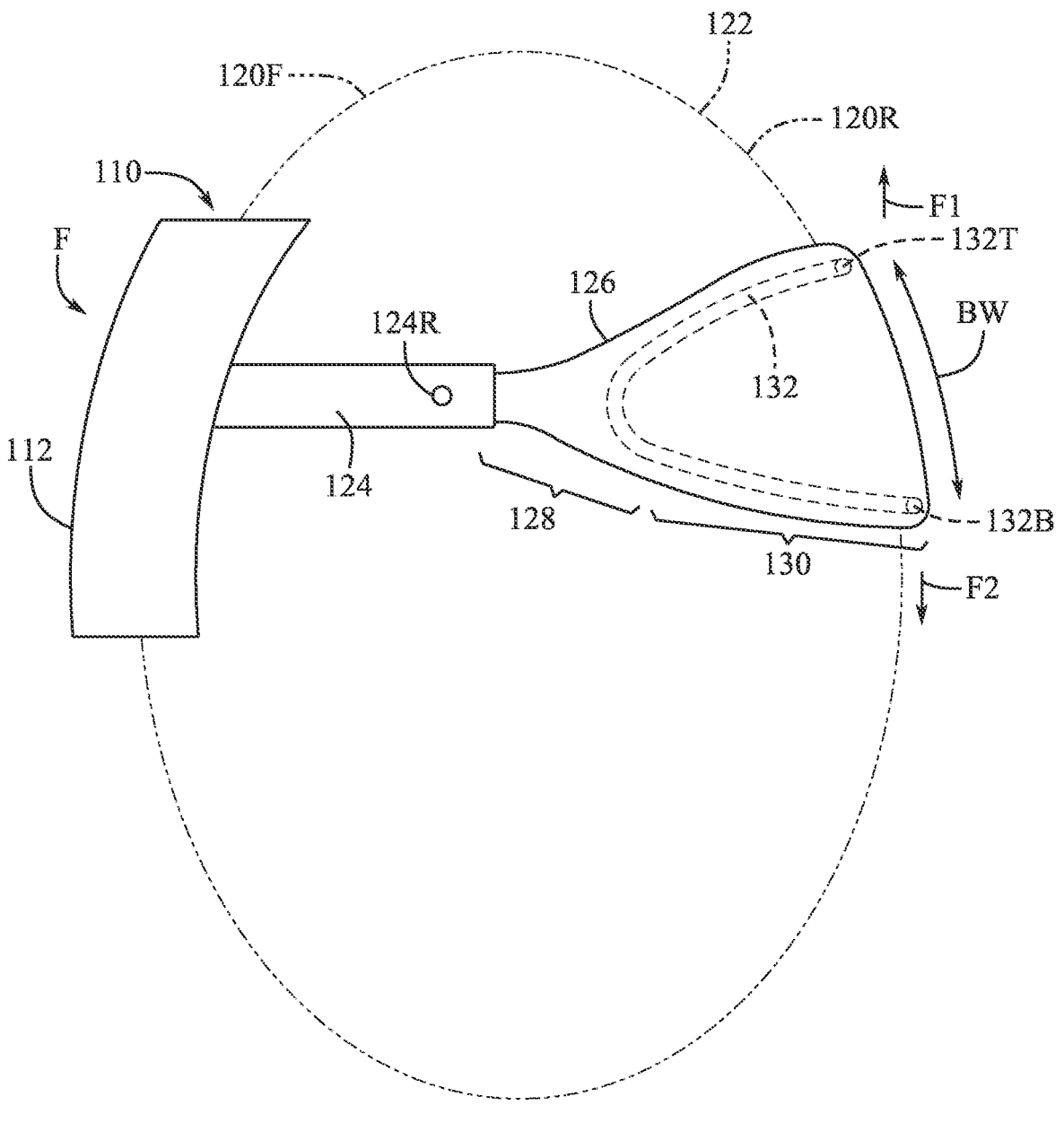
FIG. 1 is a side view of an example of a head-mountable display device with an adjustable headband.

Detailed reference will now be made to representative examples illustrated in the accompanying drawings. The following descriptions are not intended to limit the examples to one preferred example. Rather, it is intended to cover alternatives, modifications, and equivalents as can be included within the spirit and scope of the described examples as defined by the appended claims.

Portable electronic devices, such as smart phones, laptops, tablet computing devices, smart watches, head-mountable displays (HMDs), and headphones, have become commonplace for persons undertaking daily activities (travel, communication, education, entertainment, employment, etc.). Indeed, portable electronic devices can provide assistance in completing daily tasks and errands, such as, watching an instructional video or monitoring progress during and after an exercise routine. Some electronic devices, such as HMDs, require mounting systems for mounting the electronic devices on a user's body, such as on a user's head. As an example, an HMD can be mounted on a user's head using an adjustable headband, which can include a dial-based tensioning system. Tensioning systems described herein can be silent and non-back-drivable, for example tensioning systems for HMDs, so as to not cause unwanted sounds near a user's ear and to maintain the HMD on a user's head. The tensioning systems described herein can be applicable to other applications, such as lacing systems for footwear, tensioning systems for other headwear, tensioning systems for other clothing, tensioning systems for bindings, and the like.

Various examples disclosed herein relate to improved tensioning systems, such as improved dial-based tensioning systems, which can be used for adjustable headbands in head-mountable display devices along with any other applications. The improved tensioning systems include a clutch that interacts with a spool on which a cable can be wound and a wheel that can be used by a user to wind the spool. The clutch is a roller-and-wedge system, which includes rollers in roller openings of a cam wheel. When the rollers are wedged between the cam wheel and a housing of the tensioning system, the cam wheel is locked. When the rollers are not wedged between the cam wheel and the housing, the cam wheel is unlocked. The roller-and-wedge system is non-back-drivable (cable can be pushed into the tensioning system, but not pulled out of the tensioning system without rotating the wheel) and silent. The tensioning system can also include various angular restraint systems, which prevent the tensioning system from over-spooling (winding too much cable into the spool and damaging the tensioning system) and operating in a backwards direction.

HMDs described herein can include head-mountable support structures that allow the devices to be worn on the heads of users. The head-mountable support structures can include device housings for housing components, such as displays that are used for presenting a user with visual content. The head-mountable support structures for an HMD can also include headbands and other structures that help hold a device housing on the face of a user. The headband of an HMD device can be adjustable, and can include a tensioning system or the like for adjusting the headband.

These and other examples are discussed below with reference to FIGS. 1 through 9C. However, those skilled in the art will readily appreciate that the detailed description given herein with respect to these figures is for explanatory purposes only and should not be construed as limiting. Furthermore, as used herein, a system, a method, an article, a component, a feature, or a sub-feature comprising at least one of a first option, a second option, or a third option should be understood as referring to a system, a method, an article, a component, a feature, or a sub-feature that can include one of each listed option (e.g., only one of the first option, only one of the second option, or only one of the third option), multiple of a single listed option (e.g., two or more of the first option), two options simultaneously (e.g., one of the first option and one of the second option), or combination thereof (e.g., two of the first option and one of the second option).

FIG. 1 is a side view of a head-mountable display (HMD) 10 with an adjustable headband 126 (sometimes referred to herein as a "band"), in accordance with some examples. As illustrated in FIG. 1, the HMD 110 can include a head-mountable housing 112. The head-mountable housing 112 can include a main housing, a main housing unit, a head-mountable support structure, or the like. The head-mountable housing 112 can have walls or other structures that separate an interior housing region from an exterior housing region of the head-mountable housing 112. In some examples, the walls of the head-mountable housing 112 can be formed from a material such as polymer, glass, metal, combinations thereof, or the like. Electrical and optical components can be mounted in the head-mountable housing 112. These components can include components such as integrated circuits, sensors, control circuitry, input-output devices, and the like.

The HMD 110 can be used to present images to a user for viewing from eye boxes (e.g., eye boxes in which the user's eyes are located when the HMD 110 is being worn on the users' head, as representatively illustrated by a user's head 22 in FIG. 1). Specifically, the HMD 110 can include displays, lenses, and the like in the eye boxes. These components can be mounted in optical modules or other supporting structure in the head-mountable housing 112 to form respective left and right optical systems. A left display can be included for presenting an image through a left lens to a user's left eye in a left eye box and a right display can be included for presenting an image to a user's right eye in a right eye box.

In some examples, the head-mountable housing 112 can include forward-facing components, such as cameras, other sensors, and the like on a front-side F of the head-mountable housing 112. The forward-facing components can be used for gathering sensor measurements and other inputs. A soft cushion can be disposed on an opposing rear side of the head-mountable housing 112. The rear side of the head-mountable housing 112 can include openings that allow the user to view images from the left and right optical systems (e.g., when the rear of the head-mountable housing 112 is resting on a front surface 120F of the user's head 122).

The HMD 110 can include an adjustable band, such as an adjustable headband 126 or band. In some examples, the HMD 110 can include other structures (e.g., an optional over-the-head band or the like) to help hold the head-mountable housing 112 on the user's head 122. The adjustable headband 126 can have first and second ends that are physically coupled to left and right sides of the head-mountable housing 112, respectively. In the example illustrated in FIG. 1, coupling members 124 or straps, which serve as extensions of the head-mountable housing 112, are provided on the left and right sides of the head-mountable housing 112 to physically couple the adjustable headband 126 to the head-mountable housing 112. The coupling members 124 or straps can be formed from rigid materials, such as rigid polymers and/or other materials. The coupling members 124 can contain sensors, buttons, speakers, and/or other electrical components. Hinges and/or other mechanisms can be used to couple the coupling members 124 to the head-mountable housing 112. In some examples, the coupling members 124 or straps can be formed integrally as portions of the head-mountable housing 112.

The first and second ends of the adjustable headband 126 can have coupling mechanisms, such as openings, that are configured to receive posts or other protrusions 124P of the coupling members 124 or straps (or other coupling structures of the head-mountable housing 12). The adjustable headband 126 can be coupled to the coupling members 124 or straps such that a user removably attaches the adjustable headband 126 to the coupling members 124 or straps. As such, the user can remove the adjustable headband 126 from the head-mountable housing 112. The coupling members 124 or straps can have elongated shapes, as illustrated in FIG. 1, and/or other suitable shapes. Examples of the coupling members 124 or straps can include rigid straps, rigid coupling members, power straps, or the like.

The adjustable headband 126 can include a soft flexible portion, such as a central portion 130. The central portion 130 can be formed between two stiffer portions, such as end portions 128 on the left and right ends of the adjustable headband 126 (e.g., the first and second ends of the adjustable headband 126). The end portions 128 can be stiffened using embedded polymer stiffeners (e.g., single-layer or multi-layer polymer stiffening strips) and/or other stiffening members. The central portion 130 can be formed from a stretchable material such as stretchy fabric. In some examples, the central portion 130 can be formed from a band of flat knit fabric that includes stretchable strands of material (e.g., elastomeric strands) and/or which uses a stretchable fabric construction (e.g., a stretchable knit construction). The central portion 130 can include narrowed end portions, which can extend over stiffening members in the end portions 128. This can ensure that the adjustable headband 126 has a uniform external appearance. Forming the central portion 130 of a stretchable material and including the central portion in the adjustable headband 126 allows the adjustable headband 126 be stretched along its length. This allows the length of the adjustable headband 126 to be temporarily increased to help a user place the adjustable headband 126 over the user's head 122 when a user is donning the HMD 110. When the adjustable headband 126 is released, the stretchiness and the elastic nature of the central portion 130 of the adjustable headband 126 help to shorten the adjustable headband 126 and pull the adjustable headband 126 against the user's head. This allows the adjustable headband 126 to rest against a rear surface 120R the user's head.

A tensioning mechanism (such as the tensioning mechanism 100, discussed below with respect to FIGS. 2 through 5) can be included to provide further adjustment of the effective length and tension of the adjustable headband 126 to secure the adjustable headband 126 and the HMD 110 on the user's head 122. The tensioning mechanism can be provided to adjust the effective length and tension in a headband tensioning cable 132. The tensioning mechanism can be a rotatable knob, lever, slider, or other mechanism for adjusting the headband tensioning cable 132. When the effective length of the cable 132 is greater, or the tension lower, the adjustable headband 126 will be looser. The increased effective length and low cable tension of the headband tensioning cable 132 helps to create slack in the adjustable headband 126, which can aid in donning and doffing of the HMD 110. When cable tension is increased, the adjustable headband 126 is secured against the user's head.

As illustrated in FIG. 1, the headband tensioning cable 132 can have a loop shape and can include an upper cable segment 132T that runs along an upper edge of the adjustable headband 126 and an opposing lower cable segment 132B that runs along the opposing lower edge of the adjustable headband 126. In the middle of the central portion 130 of the adjustable headband 126, the upper and lower cable segments 132T and 132B can be separated by a distance BW (sometimes referred to as a cable bifurcation distance). The separation between the upper and lower cable segments 132T and 132B helps secure the adjustable headband 126 on the curved rear surface 120R of the user's head 122. When the adjustable headband 126 is worn on the rear surface 120R, as illustrated in FIG. 1, the upper cable segment 132T can apply an upward force F1 on the adjustable headband 126 that can prevent the headband 126 from slipping downwards off of the user's head 122. Similarly, the lower cable segment 132B can apply a downward force F2 that can prevent the adjustable headband 126 from slipping upwards off of the user's head 122.

Figure 2:
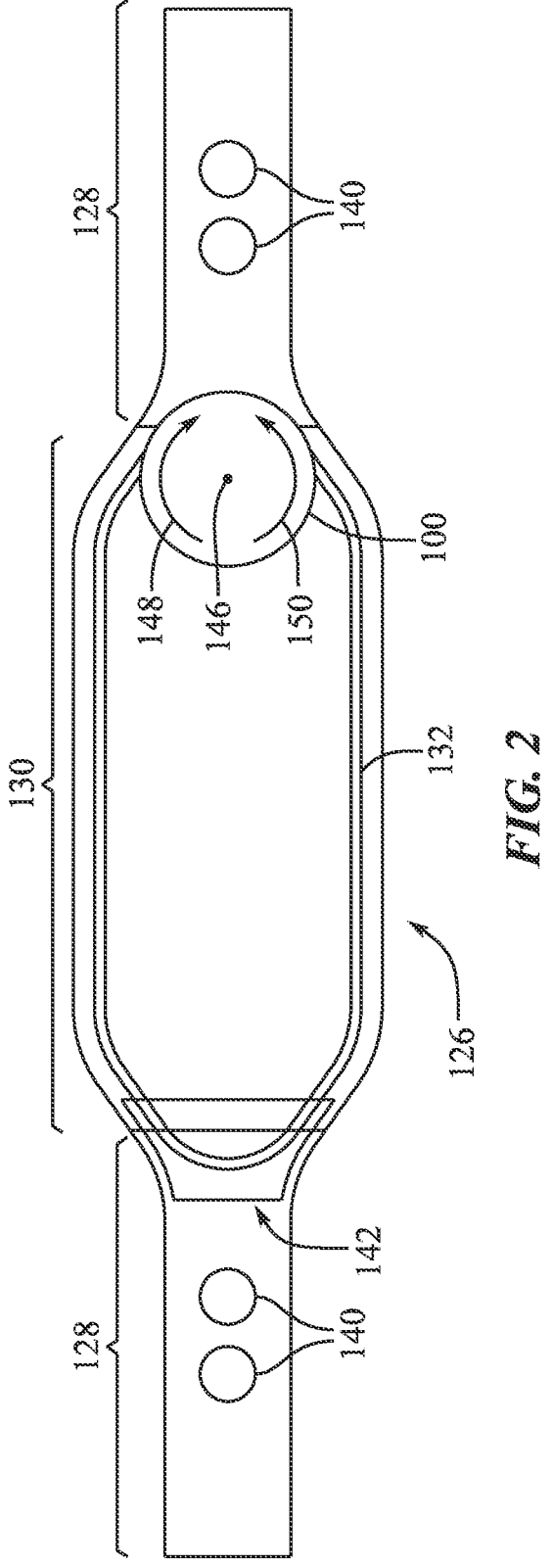
FIG. 2 is a plan view of an example of an adjustable headband.

FIG. 2 illustrates a plan view of an adjustable headband 126. The adjustable headband 126 can be substantially similar to, and can include some or all of, the features of the adjustable headband 126 discussed above with respect to FIG. 1. As illustrated in FIG. 2, the adjustable headband 126 can include a central portion 130 and end portions 128. As discussed above, the central portion 130 can be stretchable and can be formed from a stretchy knit fabric, and the end portions can be stiffened using stiffeners embedded in fabric. One or more openings 140 can be formed in the end portions 128 of the adjustable headband 126. The openings 140 can receive posts or other protrusions, such as the protrusions 124P discussed above with respect to FIG. 1. The openings 140 can be used in conjunction with the protrusions 124P to secure the end portions 128 of the adjustable headband 126 to coupling members 124 or straps of a head-mountable housing 112. In some examples, a single opening 140 or other attachment mechanism can be disposed on each of the end portions 128 of the adjustable headband 126. In some examples, each of the end portions 128 of the adjustable headband 126 can include two or more of the openings 140. In some examples, other attachment mechanisms (e.g., magnets, snaps, hook-and-loop fasteners, screws or other fasteners, combinations thereof, or the like) can be used to attach the adjustable headband 126 to the coupling members 124 or straps, or other portions of the head-mountable housing 112 in an HMD 110.

A headband tensioning cable 132 can extend in a loop around the perimeter of the central portion 130 of the adjustable headband 126. In the example illustrated in FIG. 2, the adjustable headband 126 includes a pulley 142 coupled to a left end portion 128 of the adjustable headband 126. The adjustable headband 126 includes a tensioning mechanism 100 coupled to a right end portion 128 of the adjustable headband 126. In some examples, the tensioning mechanism 100 can be an adjustment knob or dial. The tensioning mechanism 100 can be a two-way dial that can be rotated in a first direction 148 about a rotational axis 146 (e.g., a clockwise direction) to shorten the length of the loop of the headband tensioning cable 132 and thereby increase tension on the headband tensioning cable 132. The length of the loop of the headband tensioning cable 132 outside the tensioning mechanism 100 and disposed in the central portion 130 can be referred to as the "effective length" of the tensioning cable 132. A dial of the tensioning mechanism 100 can be rotated in an opposing second direction 150 about the rotational axis 146 (e.g., a counterclockwise direction) to increase the length of the loop of the headband tensioning cable 132 and thereby decrease tension on the headband tensioning cable 132. By tightening the headband tensioning cable 132, tension in the adjustable headband 126 can be increased and the HMD 110 can be held more snugly on a user's head 122. The pulley 142 can be included to allow tension in upper and lower portions of the headband tensioning cable 132 to be balanced, ensuring a consistent cupping of the adjustable headband 126 across various head shapes. By loosening the headband tensioning cable 132, effective length can be increased and the tension in the adjustable headband 126 can be decreased.

The tensioning mechanism 100 can include a variety of improvements. In some examples, the tensioning mechanism 100 can include a cam and wedge system that allows the tensioning mechanism 100 to silently spool the headband tensioning cable 132 into the tensioning mechanism 100 and silently unspool the headband tensioning cable 132 from the tensioning mechanism 100. The tensioning mechanism 100 can be non-back-drivable. In other words, the tensioning mechanism 100 can allow the headband tensioning cable 132 to be spooled into the tensioning mechanism 100 without rotating the tensioning mechanism 100, but cannot allow the headband tensioning cable 132 to be unspooled from the tensioning mechanism 100 without rotating the tensioning mechanism 100. The tensioning mechanism 100 can include an angular stop mechanism (also referred to as a hard stop, an angular stop, or the like). The angular stop mechanism prevents too much of the headband tensioning cable 132 from being spooled into the tensioning mechanism 100, preventing damage to the tensioning mechanism 100.

The angular stop mechanism also prevents the tensioning mechanism 100 from operating in a backwards direction, which can impact the user experience. The tensioning mechanism 100 can further include a spring detent or the like. The spring detent can provide a desired sound, feel, and other user experience features to the tensioning mechanism 100. These and other features of the tensioning mechanism 100 will be discussed below with respect to FIGS. 3 through 9C.

Figure 3:
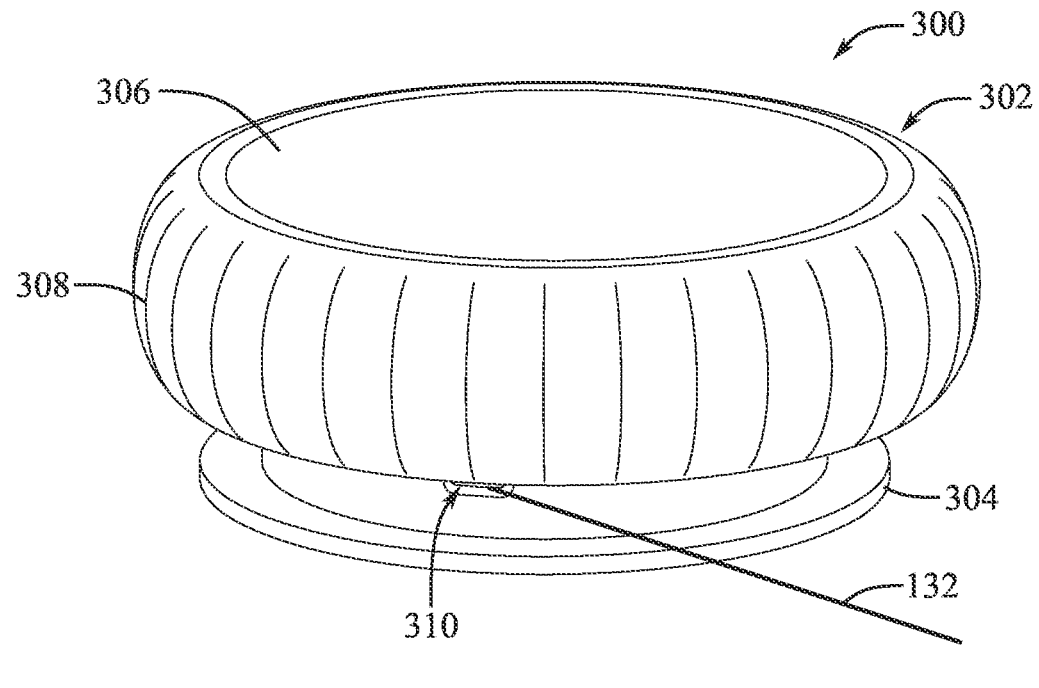
FIG. 3 is a perspective view of an example of a tensioning system for an adjustable headband.

FIG. 3 illustrates a perspective view of a tensioning mechanism or system 300 that can be included in an HMD 110 to adjust the tension in a headband tensioning cable 132 of an adjustable headband 126, in accordance with some examples. The tensioning system 300 includes a dial cap 302 and a housing 304. The housing 304 can be directly fixed to an adjustable headband 126 of the head-mounted device 110, or can be fixed to the adjustable headband 126 through an interface. The housing 104 can be fixed to the adjustable headband 126 such that the housing 304 cannot rotate relative to the adjustable headband 126.

In one example, the dial cap 302 includes a center cap 306 and a wheel 308 (also referred to as a tire or the like). The wheel 308 can be configured to be rotated by a user in order to spool the headband tensioning cable 132 into the tensioning system 300 or unspool the headband tensioning cable 132 from the tensioning system 300. The wheel 308 rotates around a central axis of the center cap 306. The center cap 306 and the housing 304 can be fixed to one another such that the center cap 306 does not rotate relative to the housing 304. As such, the wheel 308 can be rotatable relative to the center cap 306 and the housing 304.

As will be discussed in more detail below, the housing 304 can be configured to contain a spool within the housing 304. The housing 304 includes a cable opening 310. The headband tensioning cable 132 extends through the cable opening 310 into the housing 304 and is fixed to the spool. The headband tensioning cable 132 moves through the cable opening 310 as the headband tensioning cable 132 is spooled into or unspooled from the tensioning system 300, such as by rotating the wheel 308 of the dial cap 302.

Any number or variety of components in any of the configurations described herein can be included in the tensioning system and the electronic device. The components can include any combination of the features described herein and can be arranged in any of the various configurations described herein. The structure and arrangement of components of a tensioning system having a roller-and-wedge locking system described herein, can apply not only to the specific examples discussed herein, but to any number of examples in any combination. Examples of a configuration of the various components of the tensioning system relative to one another are described below, with reference to FIG. 4.

Figure 4:
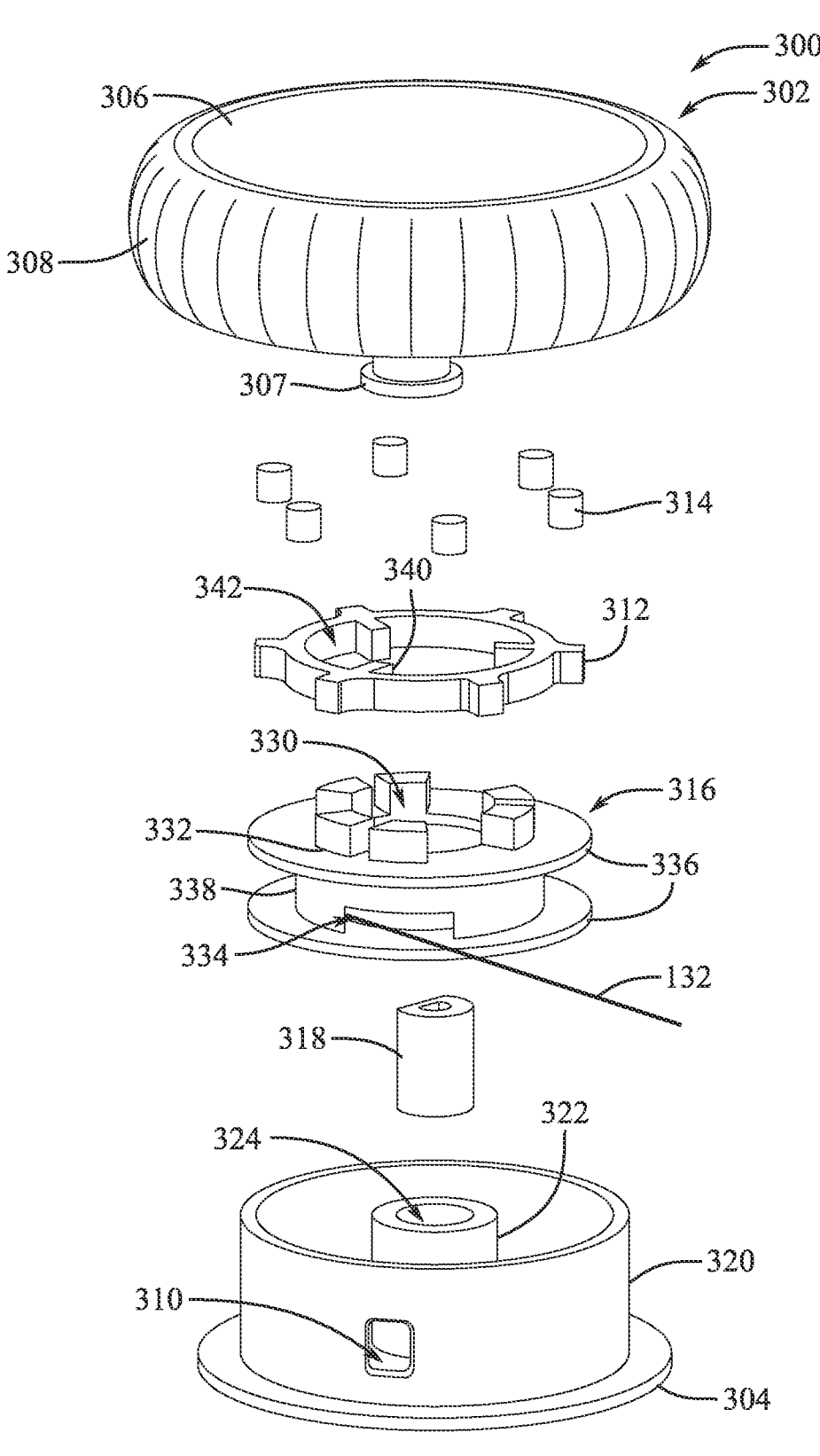
FIG. 4 is a partially exploded view of an example of a tensioning system for an adjustable headband.

FIG. 4 illustrates a partially exploded view of a tensioning system 300. The tensioning system 300 includes a headband tensioning cable 132, a dial cap 302, a housing 304, a cam wheel 312, rollers 314, a spool 316, and a cap post 318. The dial cap 302 and the housing 304 can be substantially similar to, and can include some or all of, the features of the dial cap 302 and the housing 304 discussed above with respect to FIG. 3.

The housing 304 can include a housing post 322. The housing post 322 can be disposed centrally in the housing 304. The housing 304 can further include an outer wall 320 in which a cable opening 310 is disposed.

In at least one example, the spool 316 is configured to sit in the housing 304 between the outer wall 320 and the housing post 322. The spool 316 can include a hollow central portion 330, which surrounds the housing post 322. The spool 316 can be configured to rotate around the housing post 322 while the headband tensioning cable 132 is spooled into or unspooled from the tensioning system 300. The spool 316 includes a cable opening 334, into which the headband tensioning cable 132 extends. The headband tensioning cable 132 can be retained or fixed within the cable opening 334 of the spool 316. The spool 316 includes a barrel 338 around which the headband tensioning cable 132 is wound, and flanges 336, which prevent the headband tensioning cable 132 from being wound around or into other portions of the tensioning system 300 or otherwise escaping the spool 316. The spool 316 further includes protrusions 332, which allow the spool 316 to interface with and be rotatably coupled to the cam wheel 312.

The cam wheel 312 and the rollers 314 are used to transfer rotation between the dial cap 302 and the spool 316. The cam wheel 312 can be configured to rotate the spool 316 in response to a user rotating the wheel 308 in either direction. The cam wheel 312 and the rollers 314 can be configured to allow the headband tensioning cable 132 to be spooled into the tensioning system 300 by pushing the headband tensioning cable 132 into the housing 304 (e.g., without a user rotating the wheel 308). The cam wheel 312 and the rollers 314 can be configured not to allow the cable to be unspooled from of the tensioning system 300 when the headband tensioning cable 132 is pulled. The cam wheel 312 and the rollers 314 are configured to resist torque in a first direction (e.g., a direction in which the headband tensioning cable 132 is unspooled from the tensioning system 300) and allow torque in a second direction (e.g., a direction in which the headband tensioning cable 132 is spooled into the tensioning system 300). Details of the cam wheel 312 and the rollers 314 are discussed below with respect to FIG. 5. The cam wheel 312 can include protrusions 340, which interact with the protrusions 332 of the spool 316 to transfer rotation between the spool 316 and the cam wheel 312. The cam wheel 312 includes an opening 342 and is configured to sit on top of the spool 316 between the spool 316 and the dial cap 302.

The cap post 318 can be disposed in a post opening 324 in the housing 304. The cap post 318 can be fixed to the housing 304, such that the cap post 318 is in a fixed position. In some examples, the cap post 318 can be fixed to the housing 304 through an adhesive, a fastener, or the like. In some examples, the cap post 318 can have a semi-circular cross-sectional shape. The cap post 318 can be configured to interface with a center cap post 307 of the center cap 306 to hold the center cap 306 in place in the housing 304. The cap post 318 can prevent the center cap 306 from rotating relative to the housing 304. The center cap post 307 can have a complementary cross-sectional shape to the cap post 318 (e.g., the center cap post 307 and the cap post 318 can each have semi-circular cross-sectional shapes). In some examples, the center cap post 307 can have a key-shape, and the cap post 318 can have a complementary key-hole shape.

Any number or variety of components in any of the configurations described herein can be included in the tensioning system and the electronic device. The components can include any combination of the features described herein and can be arranged in any of the various configurations described herein. The structure and arrangement of components of a tensioning system having a roller-and-wedge locking system described herein, can apply not only to the specific examples discussed herein, but to any number of examples in any combination. Examples of an operation of the tensioning system are described below, with reference to FIG. 5.

Figure 5:
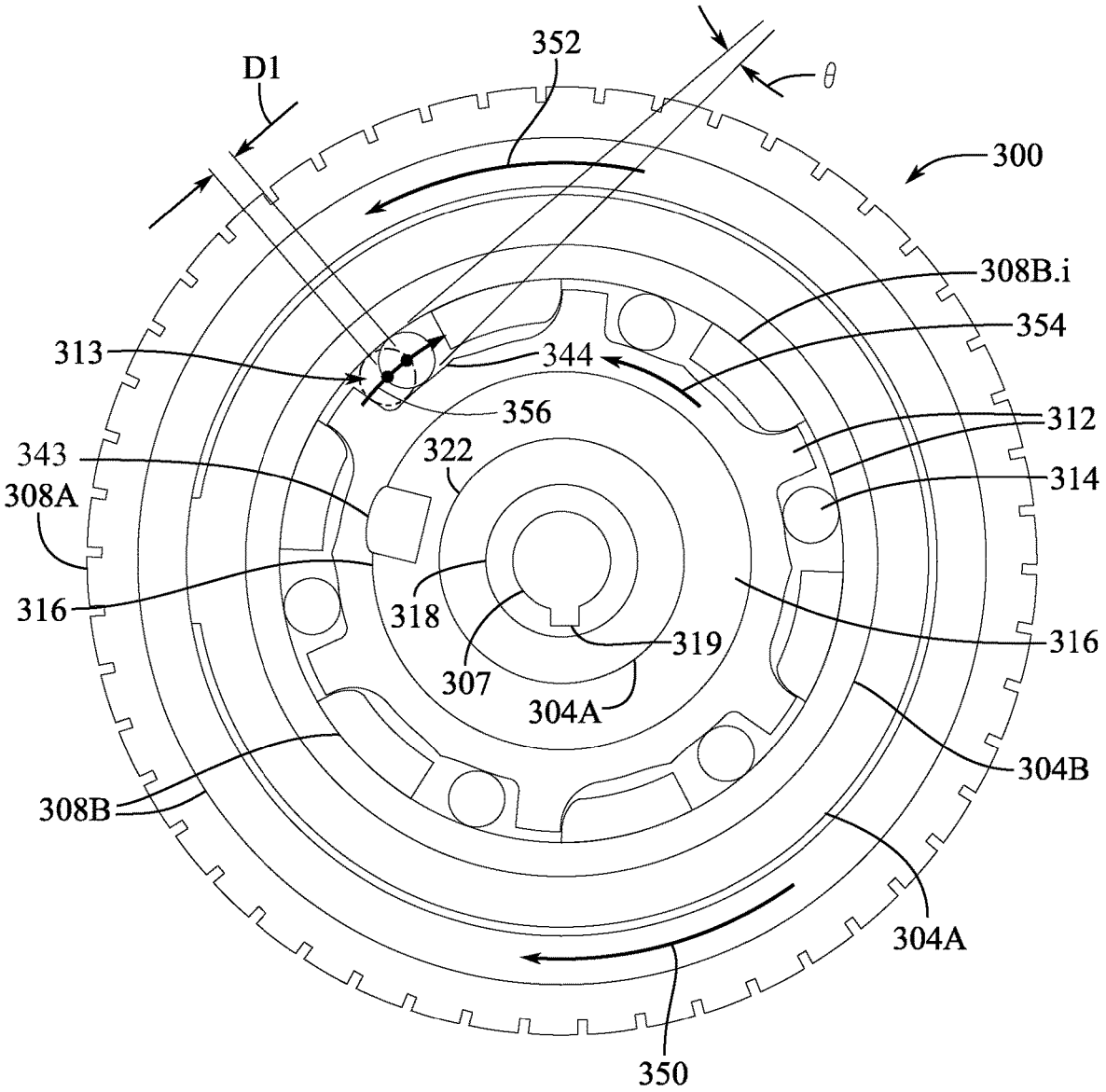
FIG. 5 is a partial cross-sectional view of an example of a tensioning system for an adjustable headband.

FIG. 5 illustrates a partial cross-sectional view of a portion of a tensioning system 300. FIG. 5 illustrates the operation of a cam wheel 312 and rollers 314 included in the tensioning system 300, in accordance with some examples. The tensioning system 300 includes a housing 304, a spool 316 in the housing 304, and a wheel 308. The wheel 308 can include an external portion 308A and an internal portion 308B. The external portion 308A is configured to be interacted with by a user. The external portion 308A can include ridges, bumps, grooves, or other features, which can be used by a user to grip the external portion. The external portion 308A can be formed of a relatively soft material, such as a rubber, a polymer, or the like. The internal portion 308B can include protrusions 308B.i, which are configured to interact with the rollers 314 and the cam wheel 312. The internal portion 308B can also be used to connect the external portion 308A to other structures of the tensioning system 300. In some examples, the internal portion 308B can include posts, and the external portion 308A can include corresponding holes in which the posts are inserted to fix the internal portion 308B and the external portion 308A to one another. In some examples, an adhesive can be disposed between the internal portion 308B and the external portion 308A to fix the internal portion 308B and the external portion 308A to one another.

The wheel 312 can include a protrusion 343, which is configured to interface with the spool 316. For example, as illustrated in FIG. 5, the spool 316 can include an opening, which has a complementary shape to the protrusion 343. This allows for the spool 316 and the wheel 312 to be rotationally coupled to one another. A cap post 318 is disposed in an opening in the housing 304. The cap post 318 can be adhered to the housing 304. The housing 304 can be physically coupled to a center cap post 307 of a center cap by a protrusion 319 of the center cap post 307. The center cap post 307, including the protrusion 319, and the cap post 318 can have complementary shapes, such that the center cap post 307 is physically coupled to (e.g., rotationally coupled to) the cap post 318 by the protrusion 319. For example, the protrusion 319 and the center cap post 307 can have a key shape, and the cap post 318 can have a complementary key-hole shape, as illustrated in FIG. 5.

The housing 304 can include a main body portion 304A and an inner ring 304B. The inner ring 304B can be configured to interact with the rollers 314, and can be formed of a relatively hard material, such as metals (e.g., stainless steel, such SAE 304 stainless steel, 420 stainless steel, or the like; aluminum, brass, or any other suitable metals), high-hardness polymers, other polymers, plastics, or the like. The main body portion 304A can be formed of a relatively soft material, such as polymers, plastics, or the like. The spool 316 can be formed of a relatively soft material, such as polymers, plastics, or the like. The inner ring 304B can be fixed to the main body portion 304A through an adhesive, fasteners, or the like.

The cam wheel 312 can include roller openings 313, in which the rollers 314 and the protrusions 308B.i are disposed. The roller openings 313 are configured to interact with the rollers 314 and the protrusions 308B.i to lock and unlock the cam wheel 312 and the housing 304 together. Specifically, the cam wheel 312 and the housing 304 can be locked together when the rollers 314 are wedged between the cam wheel 312 and the housing 304. This system can be referred to as a roller-and-wedge system or a roller-andwedge clutch. The roller openings 313 include ramped surfaces 340 that are inclined relative to the inner ring 304B of the housing 304 at a cam angle Θ. Specifically, the cam angle Θ for each ramped surface 344 defining a respective roller opening 313 can be measured between the respective ramped surface 344 and a line tangential to a point on the inner ring 304B of the housing 304 in contact with a roller 314 in the respective roller opening 313. The cam angle Θ can be in a range from about 5° to about 30°.

In at least one example, tension from the cable can supply a force to the cam wheel 312 through the spool 316, which causes the cam wheel to rotate in a third direction 354 (e.g., a counterclockwise direction). When the cam wheel 312 rotates in third direction 354 as a result of the tension in the cable 132, the rollers 314 move in a fourth direction 356 (e.g., a clockwise direction) up the ramped surfaces 340, and are wedged between the protrusions 308B.i of the internal portion 308B of the wheel 308 and the ramped surfaces 344 of the cam wheel 312 defining the roller openings 313. The wedged rollers 314 lock the cam wheel 312 and the housing 304 together due to friction being present between the cam wheel 312, the inner ring 304B of the housing 304, and the wedged rollers 314, and prevents the cable 132 from rotating the spool 316 in the third direction 354. When the cable is pushed into the tensioning system 300, the cam wheel 312 and the housing 304 are unlocked from one another. Specifically, when the cable 132 is pushed into the tensioning system 300, the cam wheel 312 rotates in a direction opposite the third direction 354, the rollers 314 are unwedged and roll down the ramped surfaces 344 in a direction opposite the fourth direction 356, and the spool 316 is free to rotate such that the cable 132 wraps around the spool 316.

In some examples, the cam wheel 312, the rollers 314, and the inner ring 304B of the housing 304 can be formed of materials such as metals (e.g., stainless steel, such SAE 304 stainless steel, 420 stainless steel, or the like; aluminum, brass, or any other suitable metals), high-hardness polymers, other polymers, plastics, or the like. In some examples, one or more of the cam wheel 312, the rollers 314, and the inner ring 304B can be coated or plated with a material to increase the hardness of the cam wheel 312, the rollers 314, and/or the inner ring 304B. In some examples, the rollers 314 can be formed of materials having a higher hardness than materials of the cam wheel 312 and the inner ring 304B. For example, the cam wheel 312, the rollers 314, and the inner ring 304B can be formed of 304 stainless steel, with a coating being applied to the rollers 314 to increase the hardness of the rollers 314 relative to the cam wheel 312 and the inner ring 304B.

The cam angle Θ can be selected based on friction resulting from the materials selected for the cam wheel 312, the inner ring 304B of the housing 304, and the rollers 314; the scale of the tensioning system 300; and clearances and tolerances required for the tensioning system; among other factors. Providing a smaller cam angle Θ allows the cam wheel 312 and the rollers 314 to lock with less friction being present between the cam wheel 312, the inner ring 304B of the housing 304, and the rollers 314. Providing too large of a cam angle Θ can allow for slipping between the cam wheel 312 and the housing 304, such that the cam wheel 312 and the housing 304 are not sufficiently locked. Providing a smaller cam angle Θ requires more space for the rollers 314 to move in order to lock the cam wheel 312 and the housing 304, which requires larger tolerances and clearances. This results in a larger dead zone between movement of the cable 132 before the cam wheel 312 and the housing 304 lock, and in movement of the wheel 308 before the spool 316 spools or unspools the cable. The dead zone (also referred to as a roller travel) can be a distance or an angular distance D1 between a center of the rollers 314 in the locked position and the unlocked position, and can be in a range from about 0.5 mm to about 8 mm, or in a range from about 5° and about 30°, respectively. A smaller cam angle $\Theta$ results in higher normal forces, which requires more force to be used to remove the rollers 314 from between the cam wheel 312 and the inner ring 304B when the cam wheel 312 and the housing 304 are locked. Providing the cam angle $\Theta$ in the prescribed range allows for the cam wheel 312 and the housing 304 to be locked without slipping, while a minimal dead zone is present and minimal force is required to rotate the wheel 308.

Although six protrusions 308B.i, six rollers 314, and six roller openings 313 are illustrated in FIG. 5, any number of the protrusions 308B.i, the rollers 314, and the roller openings 313 can be provided. Providing larger numbers of the protrusions 308B.i, the rollers 314, and the roller openings 313 can increase strength, while also increasing complexity, size, and cost. Providing smaller numbers of the protrusions 308B.i, the rollers 314, and the roller openings 313 can decrease strength, complexity, size, and cost.

FIG. 5 illustrates all of the protrusions 308B.i, the rollers 314, and the roller openings 313 facing in the same direction with respect to an axis of rotation. In some examples, half or another percentage of the protrusions 308B.i, the rollers 314, and the roller openings 313 can face in opposite directions with respect to the axis of rotation. This allows for the tensioning system 300 to be locked in both directions, rather than a single direction. In examples in which the protrusions 308B.i, the rollers 314, and the roller openings 313 face opposite directions with respect to the axis of rotation, the wheel 308 can be used to spool the cable into the spool 316 and out of the spool 316.

The wheel 308 can be rotated in a first direction 350 (e.g., a clockwise direction) around a center cap post 307 of a center cap 306 (illustrated in FIG. 4) and the housing 304 and a second direction 352 (e.g., a counterclockwise direction) opposite the first direction 350 around the center cap post 307 and the housing 304. Rotating the wheel 308 in the first direction 350 can spool a cable onto the spool 316, adding tension to the cable. In other words, rotating the wheel 308 in the first direction 350 wraps the cable onto the spool 316 in order to tighten the cable. Rotating the wheel 308 in the second direction 352 can unspool the cable from the spool 316, reducing tension in the cable. In other words, rotating the wheel 308 in the second direction 352 unwraps the cable from the spool 316 in order to loosen the cable.

Rotating the wheel 308 in the first direction 350 or the second direction 352 unlocks the cam wheel 312 and the housing 304, and allows the cable to be spooled into the tensioning system 300 or out of the tensioning system 300. For example, when the wheel 308 is rotated in the first direction 350, the rollers 314 roll down the ramped surfaces 344 and the tensioning system 300 is unlocked. When the wheel 308 is rotated in the second direction 352, the protrusions 308B.i push the rollers 314 down the ramped surfaces and the tensioning system 300 is unlocked. This allows the wheel 308 to rotate in either direction in order to increase or decrease tension on the cable.

The tensioning system 300, which includes the rollers 314 and the cam wheel 312, can be locked in either direction or both directions. In contrast to conventional systems, which can use spring-driven pawls, ratcheting systems, or the like, the tensioning system 300 uses the rollers 314, which roll within the roller openings 313 to lock and unlock the tensioning system 300. This is a silent or relatively silent system. The tensioning system 300 can be locked in one or both directions, and is thus non-back-drivable. In other words, the cable can be pushed into the tensioning system 300, but cannot be pulled from the tensioning system 300 without using the wheel 308. This allows for the cable to be spooled into the tensioning system 300 and for the tensioning system 300 to hold tension in the cable.

Any number or variety of components in any of the configurations described herein can be included in the tensioning system and the electronic device. The components can include any combination of the features described herein and can be arranged in any of the various configurations described herein. The structure and arrangement of components of a tensioning system having a roller-and-wedge locking system described herein, can apply not only to the specific examples discussed herein, but to any number of examples in any combination. Examples of a configuration of the various components of a dial cap included in the tensioning system relative to one another, and a configuration of an angular restraint are described below, with reference to FIG. 6.

Figure 6:
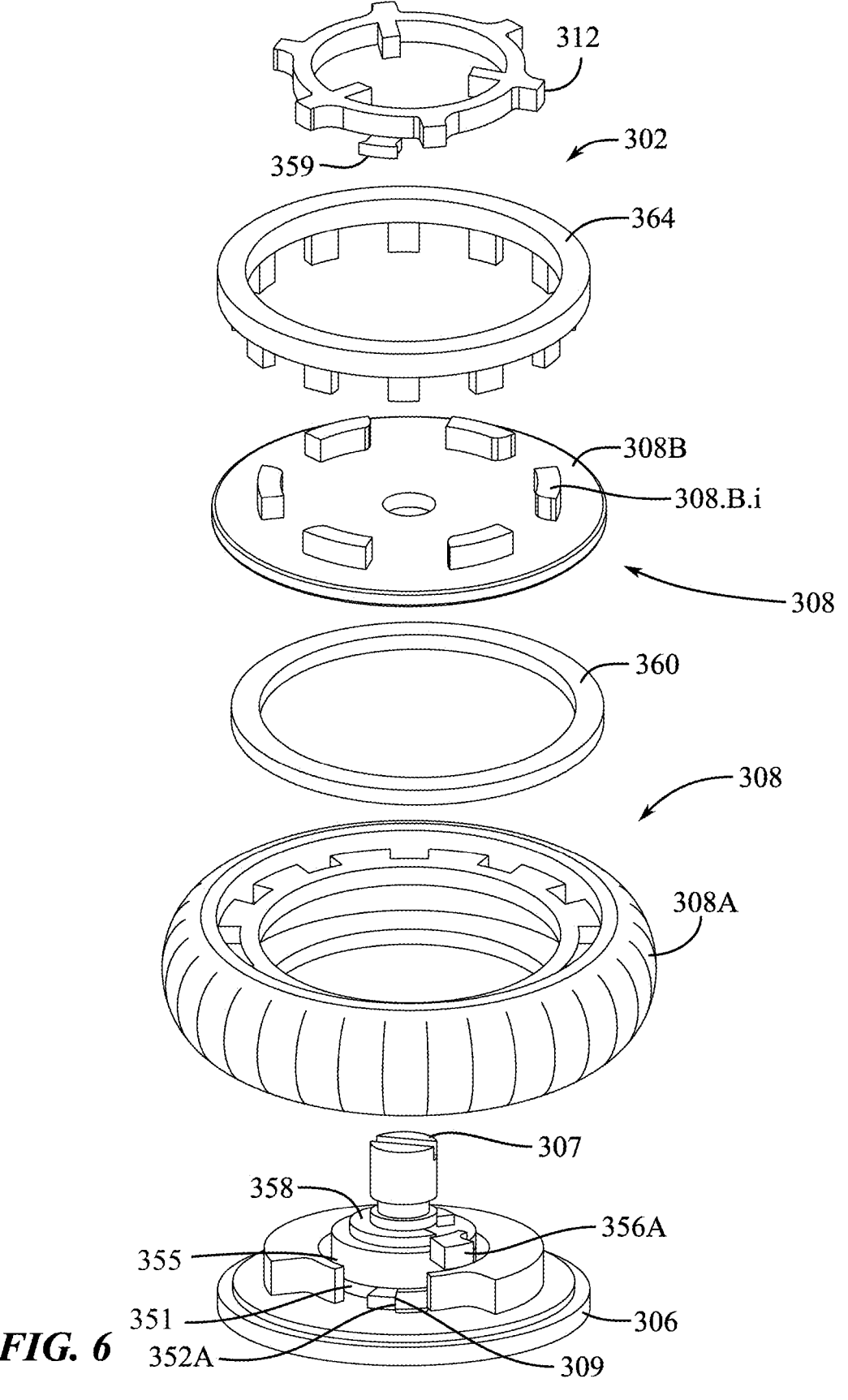
FIG. 6 is a partially exploded view of an example of a dial cap for a tensioning system.

FIG. 6 illustrates a partially exploded view of dial cap 302 and a perspective view of a cam wheel 312. The dial cap 302 includes a center cap 306, a center cap post 307, a wheel 308 including an external portion 308A and an internal portion 308B, a wheel adhesive 360, and a clamp ring 364. The center cap 306, the center cap post 307, the wheel 308, and the cam wheel 312 can be substantially similar to, and can include some or all of, the features of the center cap 306, the center cap post 307, the wheel 308, and the cam wheel 312, respectively, discussed above with respect to FIGS. 3 through 5.

As discussed previously, a user can interact with the external portion 308A of the wheel 308 to turn the wheel 308 and wind or unwind a cable in a tensioning system to tighten or loosen the cable. The internal portion 308B of the wheel 308 can include protrusions 308B.i. The protrusions 308B.i can be used to interact with rollers and the cam wheel 312 to lock and unlock the cam wheel 312 and a housing of the tensioning system. The wheel adhesive 360 and the clamp ring 364 can be used to fasten the inner portion 308B to the external portion 308A of the wheel 308.

The example of FIG. 6 includes a disc-type angular stop mechanism. Specifically, in the example of FIG. 6, a first disc 351 and a second disc 355 are included, which provide angular stops for the dial cap 302. The first disc 351 and the second disc 355 can be mounted on the center cap post 307 by a clip 358. The first disc 351 and the second disc 355 can be fastened on the center cap post 307 by any method, which allows the first disc 351 and the second disc 355 to rotate around the center cap post 307. For example, the first disc 351 and the second disc 355 can be fastened on the center cap post 307 by a pin, a clip, another fastener, or the like. The center cap 306 can include a protrusion 309, which provides an angular stop for the first disc 351.

The first disc 351 can include a first protrusion 352A, which interacts with a first side of the protrusion 309 to stop angular rotation of the first disc 351 in a first direction, or interacts with a second side of the protrusion 309 opposite the first side to stop angular rotation of the first disc 351 in a second direction opposite the first direction. The first disc 351 includes a second protrusion (such as the second protrusion 350B, discussed below with respect to FIGS. 7A and 7B) opposite the first protrusion, which interacts with the second disc 355. The second disc 355 interacts with a protrusion 359 on the cam wheel 312. The cam wheel 312 can rotate freely until the protrusion 359 interacts with a first protrusion 356A on the second disc 355. The cam wheel 312 and the second disc 355 can then rotate freely until a second protrusion (such as the second protrusion 356B, discussed below with respect to FIG. 7B) of the second disc 355 interacts with the second protrusion of the first disc 351. The cam wheel 312, the second disc 355, and the first disc 351 can then rotate freely until the first protrusion 352A of the first disc 351 interacts with the protrusion 309 of the center cap 306. When the first protrusion 352A of the first disc 351 interacts with the protrusion 309 of the center cap 306, the protrusion 309 provides an angular stop, which prevents the first disc 351, the second disc 355, and the cam wheel 312 from turning in one direction, but allows the first disc 351, the second disc 355, and the cam wheel 312 to turn in the opposite direction. This prevents a user from over-spooling a tensioning system (e.g., spooling more cable into a housing of the tensioning system than the housing is configured to hold), or from loosening the tensioning system too much such that the tensioning system winds the cable into the housing in the wrong direction.

Each of the first disc 351 and the second disc 355 can allow for roughly 360 degrees of rotation and the cam wheel 312 can allow for an additional roughly 360 degrees of rotation. Specifically, each of the first disc 351 and the second disc 355 can allow for 360 degrees of rotation minus the angular width of the protrusions included in the first disc 351, the second disc 355, the center cap 306, and the cam wheel 312. Including a larger number of discs in the angular stop increases the angular rotation allowed by the angular stop, while decreasing the number of discs in the angular stop decreases the angular rotation allowed by the angular stop. The first disc 351 and the second disc 355 can be formed of a relatively hard material, such as metals (e.g., stainless steel, such SAE 304 stainless steel, 420 stainless steel, or the like; aluminum, brass, or any other suitable metals), high-hardness polymers, other polymers, plastics, or the like. Including the first disc 351 and the second disc 355 in the angular stop and forming the first disc 351 and the second disc 355 of relatively hard materials provides a strong, robust angular stop, which is difficult for a user to damage.

Any number or variety of components in any of the configurations described herein can be included in the tensioning system and the electronic device. The components can include any combination of the features described herein and can be arranged in any of the various configurations described herein. The structure and arrangement of components of a tensioning system having a roller-and-wedge locking system and an angular restraint described herein, can apply not only to the specific examples discussed herein, but to any number of examples in any combination. Examples of a configuration and operation of a disc-type angular restraint included in the tensioning system are described below, with reference to FIGS. 7A and 7B.

Figure 7A:
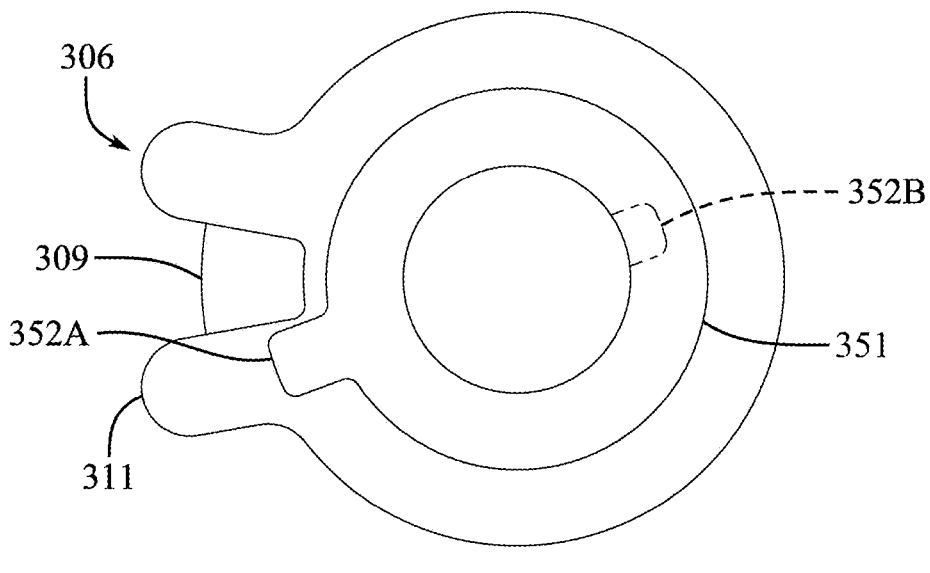
FIGS. 7A and 7B are partial cross-sectional views of an example of a disc-type angular restraint system.
Figure 7B:
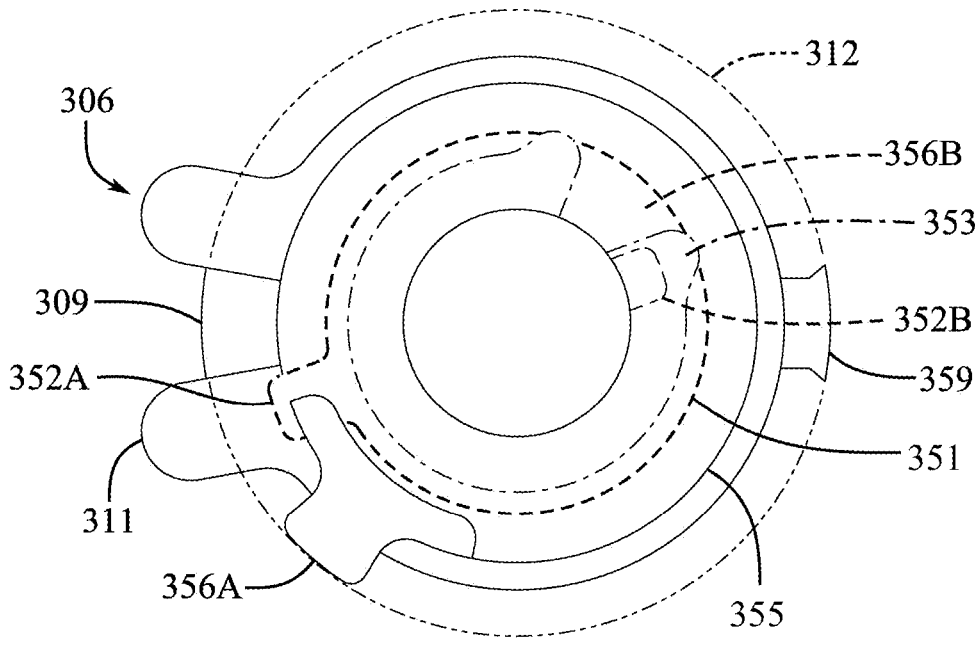

FIGS. 7A and 7B illustrate plan views of a center cap 306, a first disc 351, a second disc 355, and a cam wheel 312. FIGS. 7A and 7B illustrate additional details of the disc-type angular stop mechanism of the example illustrated in FIG. 6. The center cap 306, the first disc 351, the second disc 355, and the cam wheel 312 can be substantially similar to, and can include some or all of, the features of the center cap 306, the first disc 351, the second disc 355, and the cam wheel 312, respectively, discussed above with respect to FIG. 6.

As illustrated in FIG. 7A, the first disc 351 can sit in a channel 311 of the center cap 306. The first disc 351 is free to rotate in the channel 311, but is stopped by the first protrusion 352A of the first disc 351 contacting either side of the protrusion 309 of the center cap 306. The first disc 351 can rotate 360 degrees relative to the center cap 306, minus the angular widths of the protrusion 309 and the first protrusion 352A. The first disc 351 further includes a second protrusion 352B opposite the first protrusion 352A, which interacts with the second disc 355, illustrated in FIG. 7B.

As illustrated in FIG. 7B, the second disc 355 sits on the first disc 351. The second protrusion 352B of the first disc 351 can sit in a channel 353 of the second disc 355, which includes a second protrusion 356B opposite the first protrusion 356A. The second disc 355 is free to rotate, and begins to rotate the first disc 351 when the second protrusion 356B of the second disc 355 contacts either side of the second protrusion 352B of the first disc 351. The second disc 355 can rotate 360 degrees relative to the first disc 351, minus the angular widths of the second protrusion 352B and the second protrusion 356B.

In at least one example, the cam wheel 312 sits on the second disc 355. The cam wheel 312 can include a channel in which the second disc 355 is disposed, and the protrusion 359 of the cam wheel 312 and the first protrusion 356A of the second disc 355 can be disposed in the channel of the cam wheel 312. The cam wheel 312 is free to rotate, and begins to rotate the second disc 355 when the protrusion 359 of the cam wheel 312 contacts either side of the first protrusion 356A of the second disc 355. The cam wheel 312 can rotate 360 degrees relative to the second disc 355, minus the angular widths of the protrusion 359 and the first protrusion 356A. Although the protrusion 359 has been discussed as being disposed on the cam wheel 312, the protrusion 359 can be located on any of the parts that rotate relative to the housing and the center cap 306, such as on the spool, the wheel, or the like.

Any number or variety of components in any of the configurations described herein can be included in the tensioning system and the electronic device. The components can include any combination of the features described herein and can be arranged in any of the various configurations described herein. The structure and arrangement of components of a tensioning system having a roller-and-wedge locking system and an angular restraint described herein, can apply not only to the specific examples discussed herein, but to any number of examples in any combination. Examples of a configuration and operation of a dial cap including a ball detent mechanism that can be included in the tensioning system are described below, with reference to FIG. 8.

Figure 8:
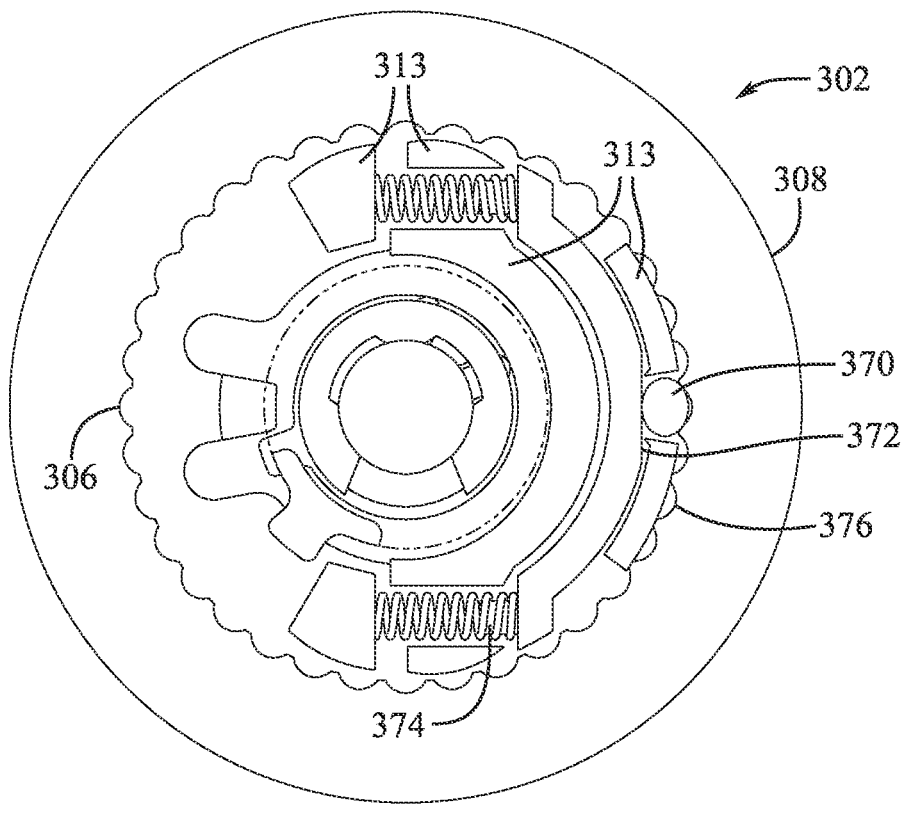
FIG. 8 is partial cross-sectional view of an example of a dial cap including a spring detent mechanism.

FIG. 8 illustrates a partial cross-sectional view of a dial cap 302. The dial cap 302 includes a center cap 306, a wheel 308, and a ball detent mechanism. The center cap 306 and the wheel 308 can be substantially similar to, and can include some or all of, the features of the center cap 306 and the wheel 308, respectively, discussed above with respect to FIGS. 3 through 6. The ball detent mechanism includes a ball 370, a detent spring 372, springs 374, and a grooved surface 376 in the wheel 308. The ball 370, the detent spring 372, and the springs 374 can be contained within protrusions 315 of the center cap 306. As described previously, the wheel 308 can rotate relative to the center cap 306. As the wheel 308 rotates, the springs 374 push the detent spring 372, which pushes the ball 370 into the grooves of the grooved surface 376 in the wheel 308. The ball detent mechanism generates both a clicking sound and a clicking feel as wheel 308 turns and the ball 370 moves between adjacent grooves of the grooved surface 376. Because the locking mechanism provided by the rollers and the cam wheel is silent, the ball detent mechanism can be included in a tensioning system in order to provide a desired user experience that includes a clicking feel and sound when the wheel 308 is rotated.

Any number or variety of components in any of the configurations described herein can be included in the tensioning system and the electronic device. The components can include any combination of the features described herein and can be arranged in any of the various configurations described herein. The structure and arrangement of components of a tensioning system having a roller-and-wedge locking system and an angular restraint described herein, can apply not only to the specific examples discussed herein, but to any number of examples in any combination. Examples of configurations and operations of various angular restraints that can be included in the tensioning system are described below, with reference to FIGS. 9A through 9C.

Figure 9A:
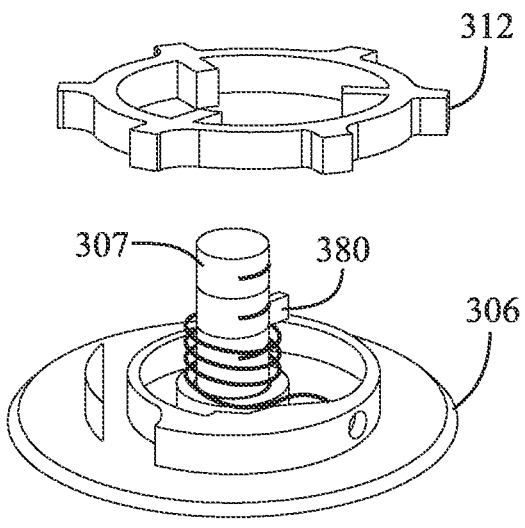
FIG. 9A through 9C are perspective views of an example of angular restraint systems.
Figure 9B:
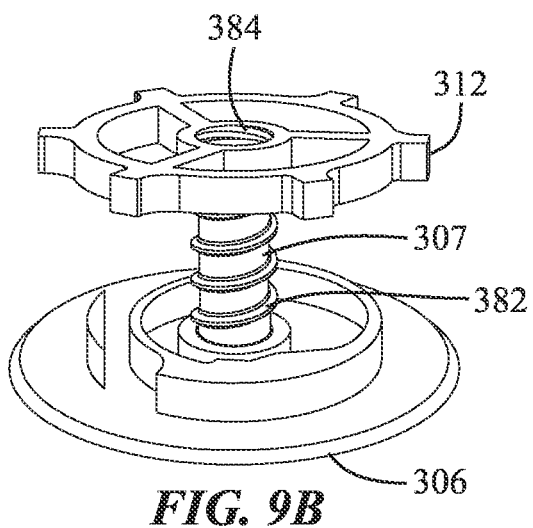
Figure 9C:
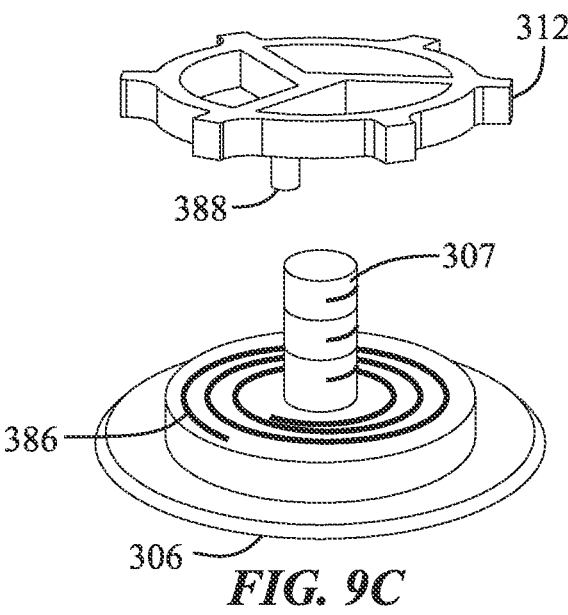

FIGS. 9A through 9C illustrate various angular stop mechanisms, which can be used in place of or in addition to the disc-type angular stop mechanism of FIGS. 6 through 7B. In the example of FIG. 9A, a cable-type angular stop mechanism is illustrated. A cable 380 can be provided and attached to a center cap 306 and a cam wheel 312. The cable 380 can be attached to the center cap 306 and the cam wheel 312 using an adhesive or the like. The cable 380 can be provided such that the cable 380 wraps around a center cap post 307 of the center cap 306 as the cam wheel 312 is rotated relative to the center cap 306. Once the cable 380 is wrapped tightly around the center cap post 307, the cable 380 prevents the cam wheel 312 from rotating relative to the center cap 306, while allowing the cam wheel 312 to rotate in the opposite direction. The cable 380 can be a cheap method for providing an angular stop mechanism for the tensioning system. This prevents a user from over-spooling a tensioning system (e.g., spooling more cable into a housing of the tensioning system than the housing is configured to hold), or from loosening the tensioning system too much such that the tensioning system winds cable into the housing in the wrong direction. Although the cable 380 has been discussed as being attached to the center cap 306 and the cam wheel 312, the cable 380 can be attached to any components of the tensioning system that are desired to include an angular stop. For example, the cable 380 can be attached to the center cap 306 and a spool of the tensioning system, a wheel of the tensioning system, or the like. In some examples, the cable 380 can be attached to a housing of the tensioning system and the cam wheel 312, the housing and the spool, the housing and the wheel, or the like.

In the example of FIG. 9B, a screw-type angular stop mechanism is illustrated. A helical ridge 382 is formed on a center cap post 307 of a center cap 306 and a corresponding helical groove 384 is formed on a cam wheel 312. As the cam wheel 312 rotates relative to the center cap 306, the cam wheel 312 moves up or down the center post 307 of the center cap 306. Vertical stops can be included on the center cap post 307, which prevent the cam wheel 312 from rotating too far in either direction. This prevents a user from over-spooling a tensioning system (e.g., spooling more cable into a housing of the tensioning system than the housing is configured to hold), or from loosening the tensioning system too much such that the tensioning system winds cable into the housing in the wrong direction. Although the helical ridge 382 has been discussed as being disposed on the center cap post 307 of the center cap 306, the helical ridge 382 can be disposed on a portion of a housing of a tensioning system or the like. The helical groove 384 can be disposed on a spool of the tensioning system or the like.

In the example of FIG. 9C, a spiral-type angular stop mechanism is illustrated. A spiral 386 is formed in a center cap 306. A center cap post 307 of the center cap 306 can be formed adjacent the spiral 386. The spiral 386 can be a spiral-shaped groove formed in the center cap 306. The spiral 386 can interact with a protrusion 388 of a cam wheel 312. The protrusion 388 can be attached to the cam wheel 312 such that the protrusion can slide relative to the cam wheel 312. For example, the protrusion 388 can slide in a direction along a radius of the cam wheel 312. As the cam wheel 312 rotates relative to the center cap 306, the protrusion 388 slides relative to the cam wheel 312 along the radius of the cam wheel 312 closer to or further from a center of the cam wheel 312 depending on which direction the cam wheel 312 turns. When the protrusion 388 reaches either end of the spiral 386, the protrusion 388 and the spiral 386 prevent the cam wheel 312 from rotating relative to the center cap 306, while allowing the cam wheel 312 to rotate in the opposite direction. This prevents a user from over-spooling a tensioning system (e.g., spooling more cable into a housing of the tensioning system than the housing is configured to hold), or from loosening the tensioning system too much such that the tensioning system winds cable into the housing in the wrong direction. Although the spiral 386 has been discussed as being disposed on the center cap 306, the spiral 386 can be disposed on a portion of a housing of a tensioning system or the like. The protrusion 388 can be disposed on a spool of the tensioning system, a wheel of the tensioning system, or the like.

Figure 10:
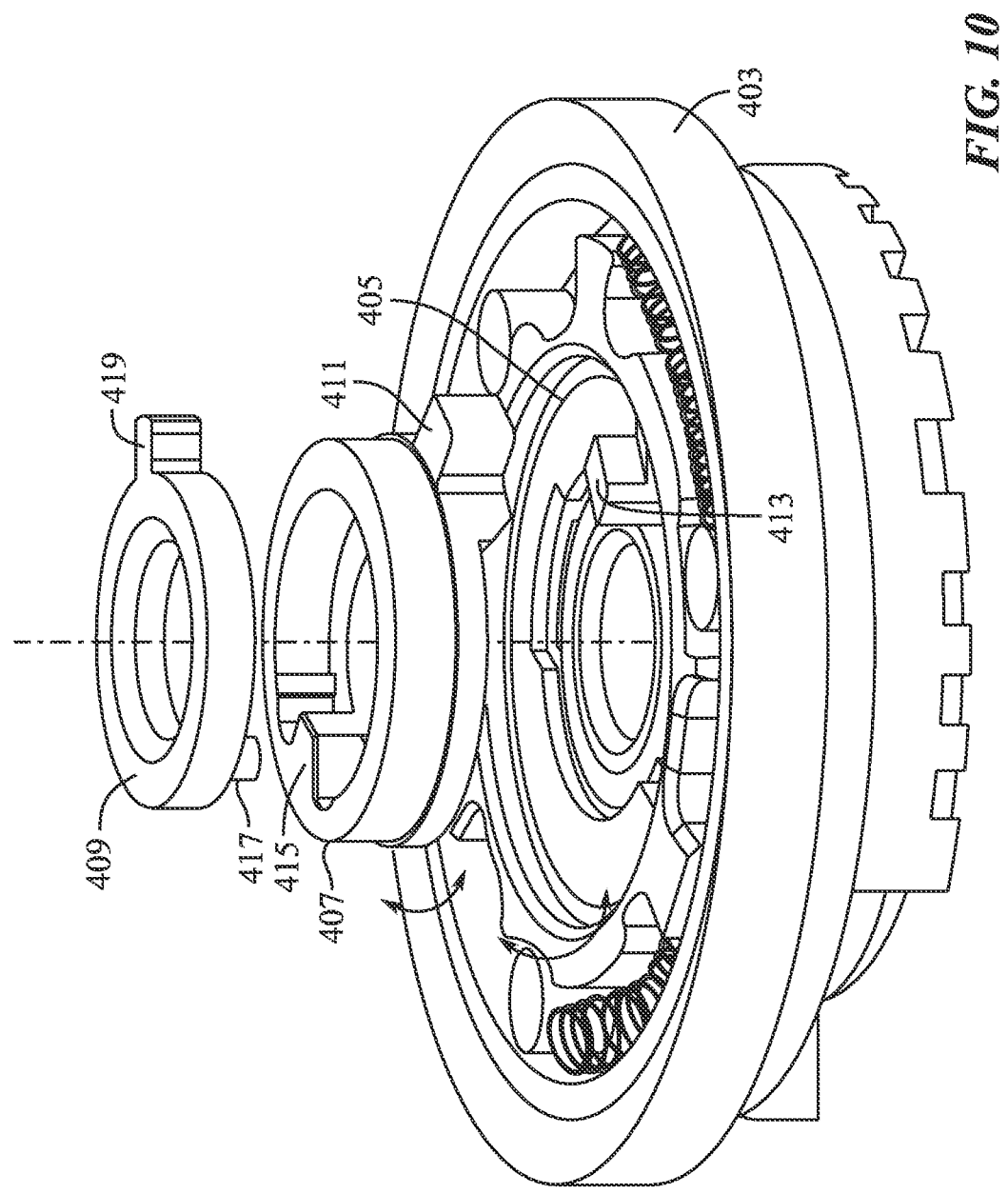
FIG. 10 is a partial exploded perspective view of a disc-type angular stop mechanism.

FIG. 10 illustrates a partially exploded view of a disc-type angular stop mechanism according to one embodiment. The disc-type angular stop mechanism shown in FIG. 10 can be substantially similar to, including some or all of the features of, the disc-type angular system described herein. In some examples, the disc-type angular stop mechanism can include a series of free-floating interlocking discs that engage with one another as rotated to limit the rotation of the dial. In the embodiment of FIG. 10, a first disc 405, a second disc 407, and a third disc 409 are included, which can provide angular stops for a dial cap. It will be understood that more or fewer discs can be used. As the number of discs increases, the amount of rotation of the dial cap can increase. In some examples, for each additional disc, the rotation of the dial cap can increase a full revolution, minus the width of the protrusions.

The first disc 405, the second disc 407, and the third disc 409 can be mounted on a center cap post, similar to the embodiment shown in FIG. 6. The first disc 405, the second disc 407, and the third disc 409 can be secured by any method, which allows for rotation. In some examples, the first disc 405, the second disc 407, and the third disc 409 are free-floating within the dial housing.

The first disc mechanism 405 can include a protrusion or a stop 413, which interacts with a second protrusion 411 of the second disc 407 to stop angular rotation of the second disc 407 in a first direction. The second disc 407 can freely rotate until the protrusion 411 contacts the stop 413. The second disc 407 can also include a stop 415. In some examples, the stop 415 extends radially inward from the second disc, while the protrusion 411 extends radially outward from the second disc 407. The third disc 409 can include a first protrusion 417 positioned to contact the stop 415 of the second disc 407 as the third disc 409 rotates relative to the second disc 407. The third disc 409 can freely rotate until the first protrusion 417 contacts the stop 415. The first protrusion 417 can, according to one example, extend downward, parallel to the axis of rotation, toward the second disc 407. The third disc 409 can further include a second protrusion 419 that extends radially outward from the third disc 409 and is configured to contact a hard stop (not shown) to limit rotation of the third disc 409. This can prevent unwanted over-rotations, such as a user from over-spooling a tensioning system (e.g., spooling more cable into a housing of the tensioning system than the housing is configured to hold), or from loosening the tensioning system too much such that the tensioning system winds the cable into the housing in the wrong direction.

Each of the first disc 405, the second disc 407, and the third disc 409 can allow for roughly 360 degrees of rotation minus the angular width of the protrusions. Including a larger number of discs in the angular stop increases the angular rotation allowed by the angular stop, while decreasing the number of discs in the angular stop decreases the angular rotation allowed by the angular stop. The first disc 405, the second disc 407, and the third disc 409 can be formed of a relatively hard material, such as metals (e.g., stainless steel, such SAE 304 stainless steel, 420 stainless steel, or the like; aluminum, brass, or any other suitable metals), high-hardness polymers, other polymers, plastics, or the like.

Figure 11:
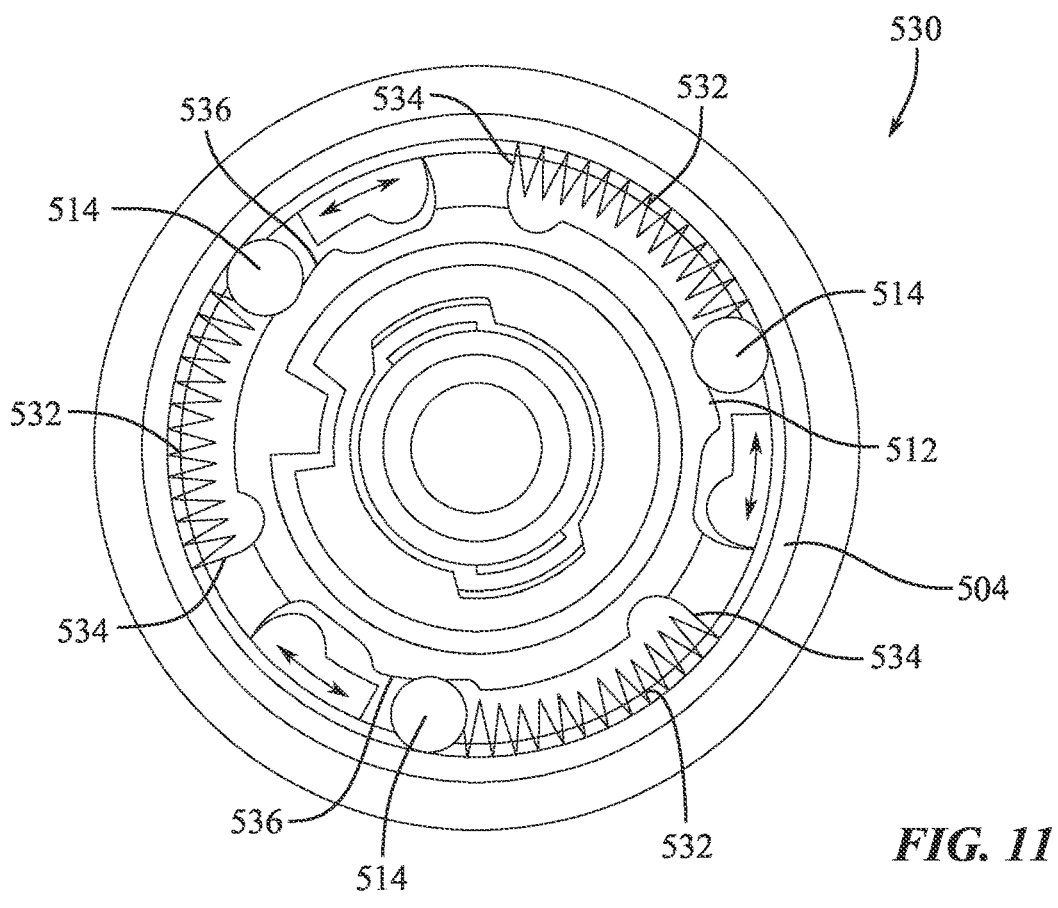
FIG. 11 is a partial cross-sectional view of an example tensioning system for an adjustable headband.

FIG. 11 illustrates a partial cross-sectional view of a portion of a tensioning system 530. The tensioning system 530 can be substantially similar to, including some or all of the features of, the tensioning systems described herein, such as tensioning system 300 of FIG. 5. FIG. 11 illustrates the operation of a cam wheel 512 and rollers 514 included in the tensioning system 530, in accordance with some examples.

The cam wheel 512 can include roller openings, in which the rollers 514 and biasing springs 532 are disposed. The roller openings are configured to interact with the rollers 514 and the biasing springs 532 to lock and unlock the cam wheel 512 and the housing 504 together. Specifically, the cam wheel 512 and the housing 504 can be locked together when the rollers 514 are wedged between the cam wheel 512 and the housing 504. This system can be referred to as a roller-and-wedge system or a roller-and-wedge clutch. The roller openings include ramped surfaces 536 that are inclined relative to the inner ring of the housing 504. This system can operate substantially similar to the tensioning system 300 of FIG. 5, however, the system 530 also include biasing springs 532 to preload the rollers 514 and avoid unwanted cable release.

As shown in FIG. 11, the exemplary tensioning system 530 can include three biasing springs 532 and three rollers 514. However, it will be understood that other numbers of rollers and springs can be provided. Providing larger numbers of rollers and springs can increase strength, while also increasing complexity, size, and cost. Providing smaller numbers of rollers and springs can decrease strength, complexity, size, and cost.

Upon tightening the cable via the tensioning system, there may be a delay when using unbiased rollers before the rollers engage and lock position, resulting in loosening of the cable. The biasing springs 532 can contact and interact with the rollers 514 to provide a biasing force on the rollers 514. In some examples, the biasing springs 532 can apply a biasing force of approximately 0.1 Newtons. The biasing springs 532 can force the rollers 514 into contact between the clutch surfaces to allow the rollers 514 to instantly lock up upon release. In some examples, the biasing springs 532 can have a curvature that follows or matches the curvature of the housing.

Any number or variety of components in any of the configurations described herein can be included in the tensioning system and the electronic device. The components can include any combination of the features described herein and can be arranged in any of the various configurations described herein. The structure and arrangement of components of a tensioning system having a roller-and-wedge locking system described herein, can apply not only to the specific examples discussed herein, but to any number of examples in any combination.

Figure 12A:
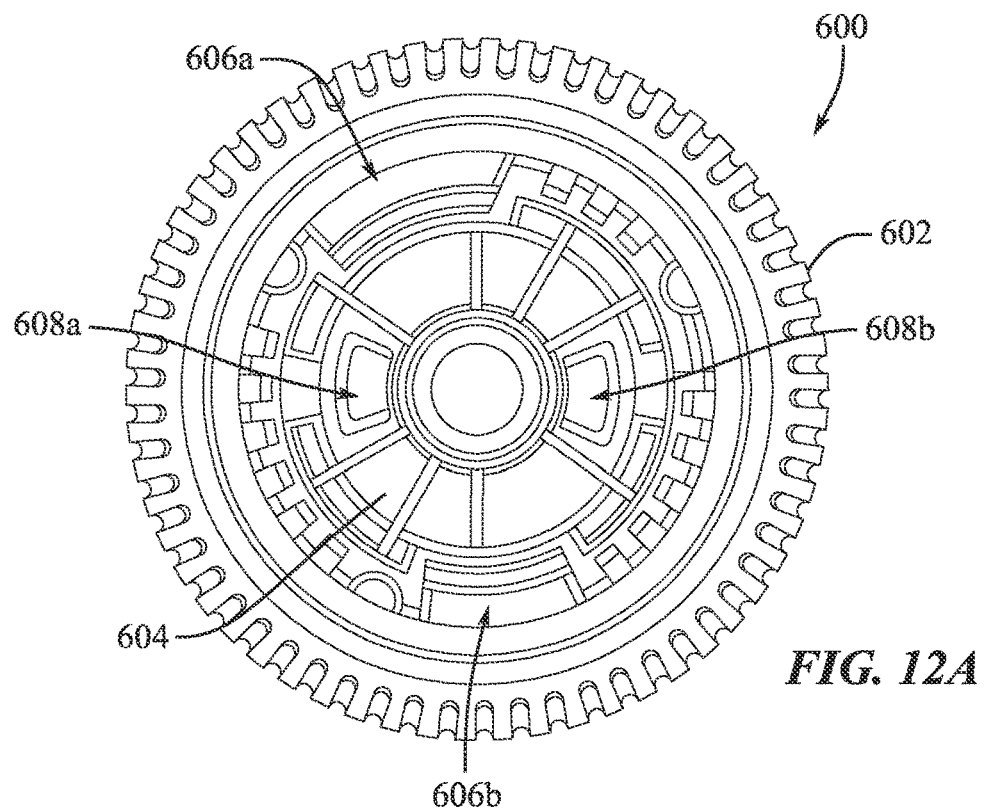
FIG. 12A is a rear view of a tensioning system.
Figure 12B:
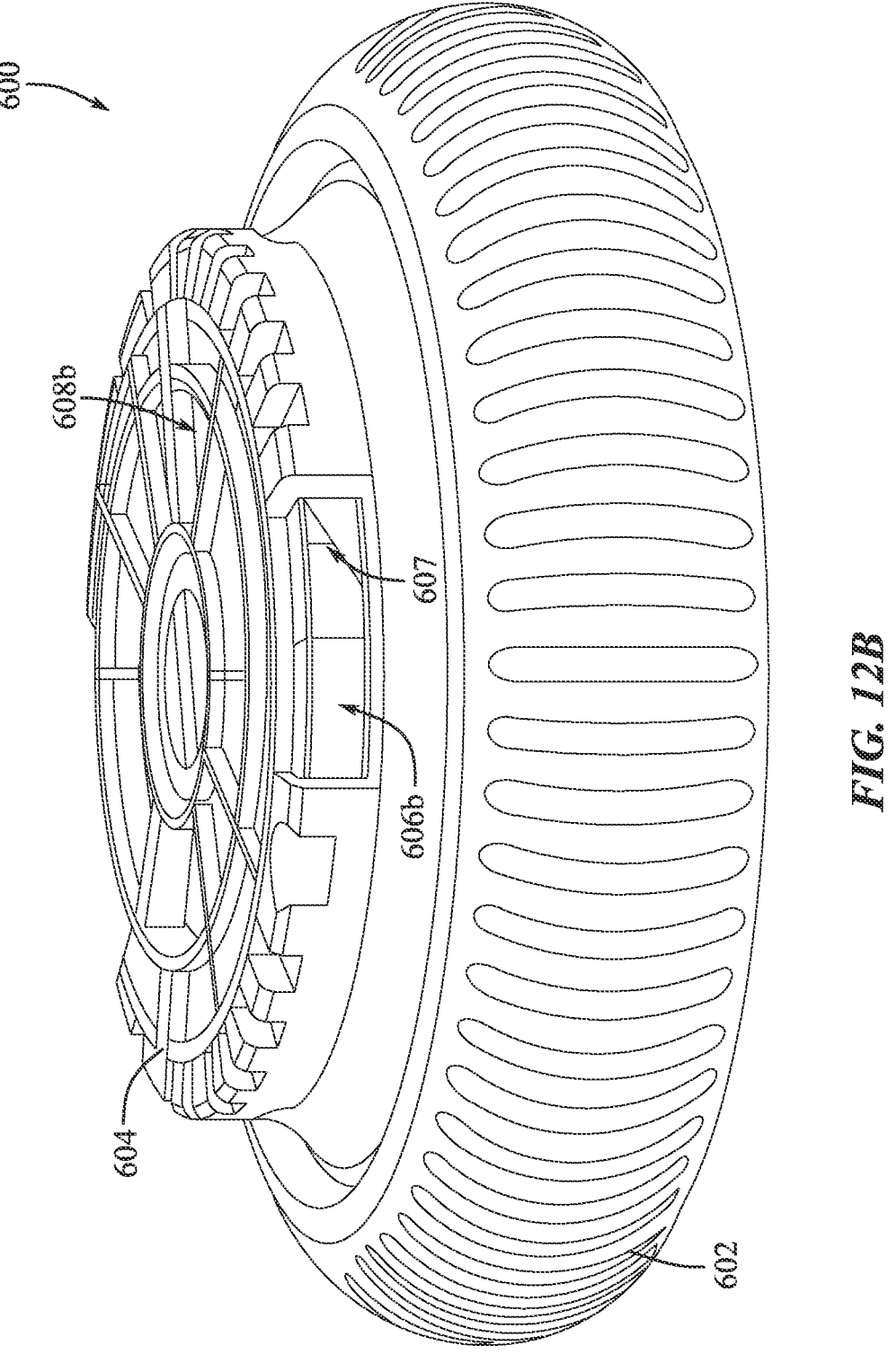
FIG. 12B is a perspective view of the tensioning system of FIG. 12A.
Figure 12C:
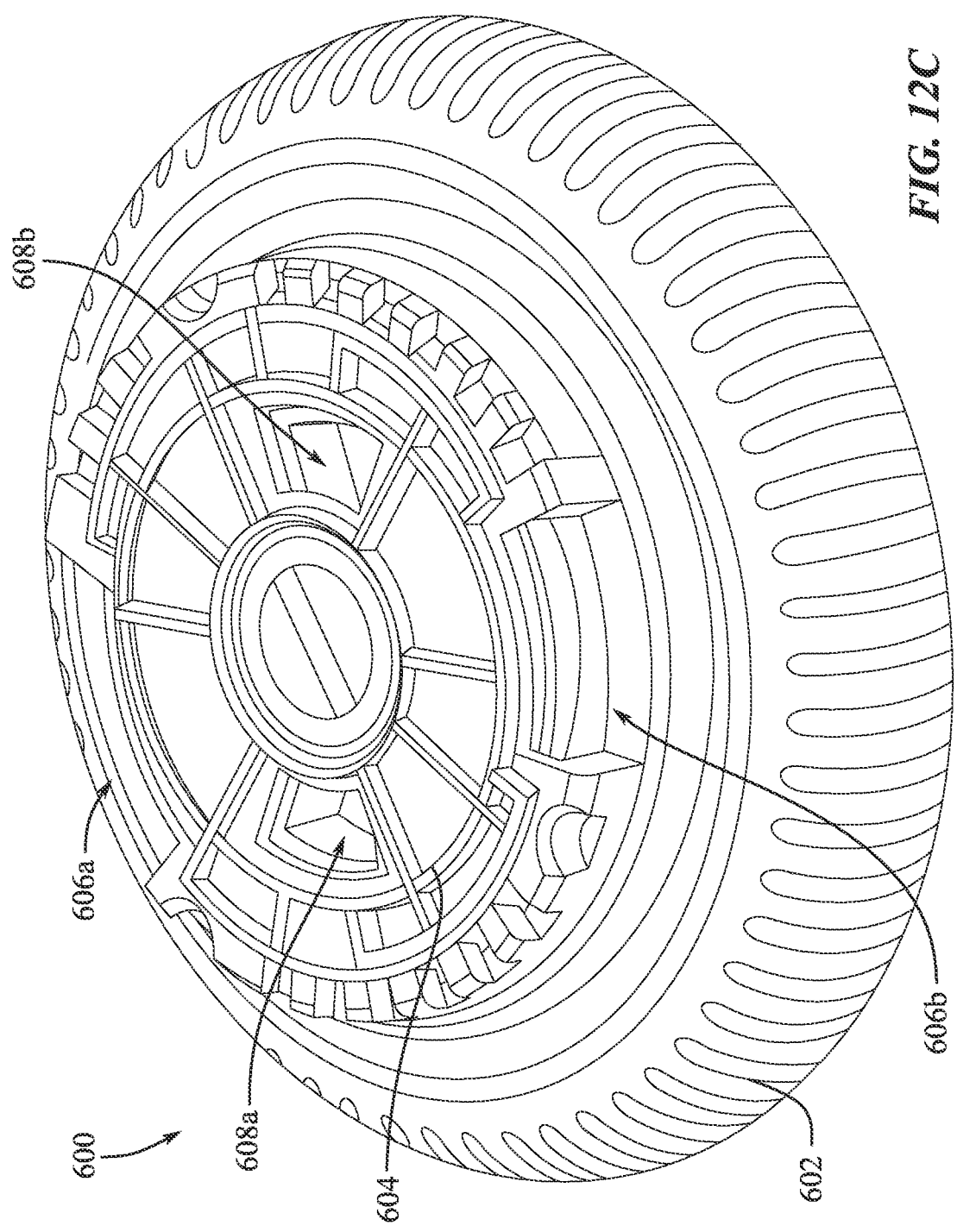
FIG. 12C is a perspective view of the tensioning system of FIG. 12A.

FIG. 12A illustrates a rear view of a cable tensioning mechanism or tensioning system 600, according to one example. FIG. 12B and FIG. 12C illustrate perspective views of the exemplary tensioning system 600. The tensioning system 600 can be substantially similar to, including some or all of the features of, the tensioning systems described herein. The tensioning system 600 can include a wheel 602 and a housing 604. The housing 604 can include one or more cable openings 606a, 606b. The headband tensioning cable can be fed or inserted into and extend through the cable openings 606a, 606b into the housing 304 and into a channel 607 of the spool. The cable openings 606a, 606b can be positioned to align with openings or channels 607 in the spool and through which the headband tensioning cable can extend.

The spool and housing 604 can define additional openings to acts as access holes or exits 608a, 608b for the cable. The exits 608a, 608b can be in communication (i.e., fluidly connected) with the openings 606a, 606b, respectively. Accordingly, as an end of the cable is inserted through the opening 606a, the end of the cable can extend from or be grabbed from the exit 608a, at which point a knot can be tied into the end of the cable, such that the knotted end is secured within a pocket of the spool (i.e., at the access holes 608a, 608b) during assembly. Likewise, as an end of the cable is inserted through the opening 606b, the end of the cable can extend from or be grabbed from the exit 608b, at which point a knot can be tied into the end of the cable.

In some examples, the spool can include openings that correspond to the opening 606a, 606b and access openings 608a, 608b. The openings in the spool can be connected via a channel 607, which accordingly also connect the openings 606a, 606b with the access openings 608a, 608b, respectively. In other words, the dial housing can define a first opening to receive an end of the cable, and a second opening to access the end of the cable, the first opening and the second opening connected via a channel defined by the spool. In some examples, upon attaching the dial in place on the head-mountable device, covers or lids can close or occlude the access openings 608a, 608b. This configuration can advantageously allow for a modular tensioning system 600 that can be manufactured separately from the headband, with the cable installed into the dial after manufacturing.

In some examples, as the cable tensioning mechanism is used, excess cable length can be unintentionally gathered or wound into the dial, potentially resulting in jamming of the cable and inefficient operation of the cable tensioning mechanism. A cable limiter can be provided to intentionally increase tension or friction on the cable in order to prevent the excess cable take up, thereby reducing the risk of jamming. In some examples, the dial can include resistance points interfacing with the cable as it moves in and out of the dial. The cable limiters can include any suitable material to produce tension or friction on the cable. For example, the cable limiters can include any suitable silicone, rubber, or elastomer. In some examples, the cable limiters can include a plug having a through-hole, through which the cable travels at the exits of the dial. The cable limiters can be positioned at or in the openings that the cable passes to enter into the dial housing and spool.

In some examples, the present systems and methods can gather, save, use, and/or disseminate personal information data in order to improve the systems and methods, as well as the user experience. In examples where personal information data is gathered, saved, used, and/or disseminated, the gathering, saving, use and/or dissemination should be performed according to privacy policies and practices that are generally recognized as meeting or exceeding industry or governmental requirements for maintaining personal information data private and secure. However, the present systems and methods can be performed without such personal information data.

The foregoing description includes specific nomenclature to provide a thorough understanding of the described examples. However, the specific details are not required in order to practice the described examples and were merely provided for illustration and description. They are not intended to be exhaustive or to limit the examples to the precise forms disclosed. Rather, many modifications and variations are possible in view of the above teachings.

What is claimed is:

1. A head-mountable electronic device, comprising:
a display;
a housing connected to the display;
a strap connected to the housing; and
an adjustable headband connected to the strap, the adjustable headband comprising:
a band;
a cable connected to the band; and
a tensioning system connected to the band and the cable, the tensioning system comprising:
a dial housing;
a cam wheel in the dial housing, the cam wheel including a ramped surface defining a roller opening;
a dial wheel including a protrusion extending into the roller opening; and
a roller disposed in the roller opening adjacent the protrusion and between the ramped surface and the dial housing, wherein:
the ramped surface being inclined relative to a line tangential to a point on the dial housing in contact with the roller; and
the roller is configured to roll along the ramped surface and wedge between the ramped surface and the dial housing to selectively lock the cam wheel.

2. The device of claim 1, wherein:
the roller is configured to roll along the ramped surface and be wedged between the ramped surface and the dial housing to lock the cam wheel and the dial housing together in response to the cable moving in a first direction; and
the roller is configured to roll along the ramped surface to unlock the cam wheel and the dial housing in response to the cable moving in a second direction opposite the first direction.

3. The device of claim 2, wherein:
the roller opening is a first roller opening, the ramped surface is a first ramped surface, and the roller is a first roller;
the cam wheel further including a second ramped surface defining a second roller opening;

the tensioning system further comprises a second roller disposed in the second roller opening between the second ramped surface and the dial housing; and
the second roller is configured to roll along the second ramped surface to lock the cam wheel and the dial housing together in response to the cable moving in the second direction opposite the first direction.

4. The device of claim 1, wherein the dial wheel is configured to unlock the cam wheel and the dial housing in response to the dial wheel being rotated in a second direction or a third direction opposite the second direction.

5. The device of claim 1, wherein a cam angle measured between the ramped surface and the line is from 5 degrees to 30 degrees.

6. The device of claim 1, wherein the roller is configured to travel angularly in the roller opening in a range from 1 degree to 20 degrees.

7. The device of claim 1, wherein the tensioning system comprises six rollers in six roller openings defined by the cam wheel.

8. An adjustable-tension headband for a head-mountable display (HMD), the adjustable-tension headband comprising:
a band;
a cable fastened to the band; and
an adjustable cable tensioning mechanism fastened to the band, the adjustable cable tensioning mechanism comprising:
a spool, wherein the cable is fastened to the spool;
a cam wheel rotatably attached to the spool and including a ramped surface defining a roller opening; and
a roller in the roller opening, the roller configured to roll along the ramped surface and wedge between the ramped surface and the spool to selectively lock and unlock the spool.

9. The adjustable-tension headband of claim 8, wherein the adjustable cable tensioning mechanism further comprises:
a dial housing in which the spool and the cam wheel are disposed;
and
wherein the dial housing defines a first opening to receive an end of the cable, and a second opening to access the end of the cable, the first opening and the second opening connected via a channel defined by the spool.

10. The adjustable-tension headband of claim 8, the adjustable cable tensioning mechanism further comprising a dial wheel configured to adjust an effective length of the cable, wherein:
the dial wheel is configured to rotate in a first direction, and a second direction opposite the first direction; and
the dial wheel is configured to unlock the spool in response to the dial wheel being rotated in the first direction or the second direction.

11. The adjustable-tension headband of claim 10, wherein:
the dial wheel comprises an internal portion including a protrusion extending into the roller opening; and
the protrusion is configured to contact the roller to unlock the spool in response to the dial wheel being rotated in the first direction.

12. The adjustable-tension headband of claim 8, wherein the adjustable cable tensioning mechanism further comprises:
a dial center cap rotatably fixed relative to the band, the dial center cap including a first protrusion and a dial center cap post;

a second protrusion rotatably coupled to the cam wheel; and a first disc mounted on the dial center cap post;

wherein:

the first disc includes a third protrusion configured to interact with the first protrusion, and a fourth protrusion configured to interact with the second protrusion; and the first disc is configured to provide an angular restraint between the dial center cap and the cam wheel.

13. The adjustable-tension headband of claim 8, wherein the adjustable cable tensioning mechanism further comprises:

a dial center cap rotatably fixed relative to the band, the dial center cap comprising a dial center cap post; and a restraint cable comprising a first end mounted on the dial center cap and a second end rotatably coupled to the cam wheel;

wherein:

the restraint cable is configured to wrap around or unwrap from the dial center cap post in response to the cam wheel rotating; and the restraint cable is configured to provide an angular restraint between the dial center cap and the cam wheel.

14. The adjustable-tension headband of claim 8, wherein:

the adjustable cable tensioning mechanism further comprises a dial center cap rotatably fixed relative to the band, the dial center cap including a dial center cap post, the dial center cap post having a helical ridge;

the cam wheel comprises a helical groove; and the helical ridge and the helical groove are configured to provide an angular restraint between the dial center cap and the cam wheel.

15. The adjustable-tension headband of claim 8, wherein the adjustable cable tensioning mechanism further comprises:

a dial center cap rotatably fixed relative to the band, the dial center cap comprising a spiral groove; and a restraint protrusion slidably fixed to the cam wheel;

wherein:

the restraint protrusion is disposed in the spiral groove; and the restraint protrusion and the spiral groove are configured to provide an angular restraint between the dial center cap and the cam wheel.

16. A tensioning system, comprising:

a cable;

a cam wheel comprising a ramped surface defining a roller opening;

a dial housing encircling the cam wheel; and a roller disposed in the roller opening;

wherein:

the roller is configured to roll along the ramped surface;

the roller is configured to wedge between the ramped surface and the dial housing to lock the cam wheel and the dial housing when the cable moves in a first direction; and the roller is configured to unlock the cam wheel from the dial housing when the cable moves in a second direction opposite the first direction.

17. The tensioning system of claim 16, further comprising:

a dial center cap rotatably coupled to the dial housing; and a dial wheel between the dial center cap and the dial housing;

wherein:

the dial wheel is configured to unlock the cam wheel and the dial housing, and to add tension to the cable when the dial wheel rotates in a third direction; and the dial wheel is configured to unlock the cam wheel and the dial housing, and to reduce tension in the cable when the dial wheel rotates in a fourth direction opposite the third direction.

18. The tensioning system of claim 17, further comprising an angular restraint rotatably coupled to the dial center cap and the dial wheel, wherein the angular restraint is configured to limit an angular rotation of the dial wheel when the dial wheel rotates in the third direction and the fourth direction.

19. The tensioning system of claim 17, wherein:

the dial center cap further comprises a ball, and a detent spring in contact with the ball;

the dial wheel further comprises a grooved internal surface adjacent the ball;

the detent spring is configured to push the ball into the grooved internal surface of the dial wheel; and the detent spring and the ball are configured to click when the dial wheel rotates in the third direction or the fourth direction.

20. The tensioning system of claim 16, wherein:

the dial housing comprises an inner housing ring configured to contact the roller;

the inner housing ring comprises a first material having a first hardness;

the cam wheel comprises a second material having a second hardness;

the roller comprises a coating material having a third hardness; and the third hardness is greater than the second hardness and the first hardness.

* * * * *